United States Patent
Hagihara

(10) Patent No.: US 9,204,076 B2
(45) Date of Patent: Dec. 1, 2015

(54) IMAGING APPARATUS

(71) Applicant: OLYMPUS CORPORATION, Tokyo (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/607,786

(22) Filed: Jan. 28, 2015

(65) Prior Publication Data

US 2015/0144771 A1     May 28, 2015

Related U.S. Application Data

(63) Continuation of application No. PCT/JP2014/071312, filed on Aug. 12, 2014.

(30) Foreign Application Priority Data

Sep. 13, 2013    (JP) .................................. 2013-190714

(51) Int. Cl.
    *H04N 5/378*        (2011.01)
    *H03M 1/56*         (2006.01)

(52) U.S. Cl.
    CPC ................. *H04N 5/378* (2013.01); *H03M 1/56* (2013.01)

(58) Field of Classification Search
    CPC ................................ H04N 5/378; H03M 1/56
    USPC ................... 250/208.1; 348/302, 308
    See application file for complete search history.

(56) References Cited

U.S. PATENT DOCUMENTS

| | | | | |
|---|---|---|---|---|
| 2002/0005858 A1* | 1/2002 | Aoki | .............................. | 345/618 |
| 2010/0271519 A1* | 10/2010 | Ui et al. | ........................ | 348/302 |

(Continued)

FOREIGN PATENT DOCUMENTS

| | | |
|---|---|---|
| JP | 2005-303648 A | 10/2005 |
| JP | 2008-92091 A | 4/2008 |
| JP | 2012-100194 A | 5/2012 |

(Continued)

OTHER PUBLICATIONS

Niitsu et al., "A Clock Jitter Reduction Circuit Using Gated Phase Blending Between Self-Delayed Clock Edges", 2012 Symposium on VLSI Circuits Digest of Technical Papers, pp. 142-143.

(Continued)

*Primary Examiner* — Seung C Sohn
(74) *Attorney, Agent, or Firm* — Westerman, Hattori, Daniels & Adrian, LLP

(57) ABSTRACT

An imaging apparatus includes a clock generation unit that generates a plurality of phase signals having phases different from one another, a signal transmission unit provided to correspond to the plurality of phase signals and having a plurality of signal transmission circuits, and a latch unit having a plurality of latch circuits that latches the phase signals transmitted by the signal transmission unit at a timing of an end of a comparison process performed by a comparison unit. A configuration of the signal transmission circuit that transmits a first phase signal is substantially the same as a configuration of the signal transmission circuit that transmits a second phase signal different from the first phase signal. A configuration of the latch circuit that latches the first phase signal is substantially the same as a configuration of the latch circuit that latches the second phase signal.

4 Claims, 12 Drawing Sheets

(56) References Cited

U.S. PATENT DOCUMENTS

2010/0271525 A1* 10/2010 Takahashi ..................... 348/308
2011/0122274 A1* 5/2011 Itzhak et al. ............... 348/222.1

FOREIGN PATENT DOCUMENTS

| JP | 2012-191269 A | 10/2012 |
| JP | 2013-62584 A | 4/2013 |
| WO | 2013/122221 A1 | 8/2013 |

OTHER PUBLICATIONS

International Search Report dated Oct. 28, 2014 issued in corresponding application No. PCT/JP2014/071312.

* cited by examiner

IMAGING APPARATUS

This application is a continuation application based on PCT Patent Application No. PCT/JP2014/071312, filed on Aug. 12, 2014, whose priority is claimed on Japanese Patent Application No. 2013-190714, filed on Sep. 13, 2013. The contents of both the PCT Patent Application and the Japanese Patent Application are incorporated herein by reference.

BACKGROUND OF THE INVENTION

1. Field of the Invention

The present invention relates to an imaging apparatus.

2. Description of Related Art

A so-called column analog-to-digital converter (ADC) type solid-state imaging apparatus in which an AD conversion function is embedded in a column unit provided to correspond to each column of a pixel array disposed in a matrix in an imaging unit has been proposed. As AD conversion schemes, (1) a sequential comparison AD conversion scheme, (2) a single-slope AD conversion scheme, (3) a cyclic AD conversion scheme, (4) a ΔΣ AD conversion scheme, and the like have been proposed.

In the single-slope AD conversion scheme, AD conversion is performed as follows (for example, see Japanese Unexamined Patent Application, First Publication No. 2005-303648). An analog pixel signal read in a row unit from each pixel of the imaging unit via a vertical signal line is compared to a reference signal having a ramp-shaped waveform, so that a pulse signal having a magnitude (pulse width) in a time-axis direction corresponding to a magnitude of the pixel signal is generated. In the period of the pulse width of the pulse signal, a clock of a predetermined frequency is counted. A count value generated in the count operation becomes digital data corresponding to a magnitude of the pixel signal.

Recently, as means for speed-up of the single-slope AD conversion scheme, an column ADC type solid-state imaging apparatus using a time-to-digital converter (TDC) type AD conversion scheme has been proposed. As an example of a solid-state imaging apparatus using a TDC type AD conversion circuit, a configuration described in Japanese Unexamined Patent Application, First Publication No. 2008-92091 is known. FIG. 12 illustrates a part of a configuration of the TDC type AD conversion circuit when an oscillation circuit as a so-called "asymmetric oscillation circuit" is used as a voltage controlled oscillator (VCO) of an AD conversion circuit. First, the configuration and operation of the circuit of FIG. 12 will be described.

The circuit illustrated in FIG. 12 includes a VCO 1100, a latch unit 1108, a count unit 1105, a detection circuit 1107, and an encoding circuit 1106. The VCO 1100 includes an oscillation circuit in which seventeen delay units (NAND circuits NAND[0] to NAND[16]) are connected in a ring shape. The latch unit 1108 latches lower phase signals output from the VCO 1100. The lower phase signals include a plurality of phase signals CK[0] to CK[15] having phases different from each other. The count unit 1105 has a counter circuit which counts a lower phase signal CK[15] from the NAND circuit NAND[15] output through the latch unit 1108 as a count clock. The detection circuit 1107 detects a predetermined logic state based on the lower phase signals CK[0] to CK[15] latched in the latch unit 1108. The encoding circuit 1106 encodes the logic state detected by the detection circuit 1107 into a binary number.

A start pulse StartP is input to one input terminal of the NAND circuit NAND[0] constituting the VCO 1100 and an output signal of the NAND circuit NAND[16] is input to the other input terminal thereof. A power supply voltage VDD is input to one input terminal of each of the NAND circuits NAND[1] to NAND[15] and an output signal of the NAND circuit of a previous stage is input to the other input terminal thereof. The power supply voltage VDD is set to a high level during an operation period of the AD conversion circuit. An output signal of the NAND circuit NAND[13] is input to one input terminal of the NAND circuit NAND[16] and an output signal of the NAND circuit NAND[15] of a previous stage is input to the other input terminal thereof. An output signal of the NAND circuit NAND[13] is input to the NAND circuit NAND[16] three stages later, in addition to the NAND circuit NAND[14] one stage later.

A signal based on the start pulse StartP input to the NAND circuit NAND[0] is transmitted through two types of paths and passes through the NAND circuits NAND[0] to NAND[16]. A first path is a path to which a signal is transmitted through a signal line which connects the other input terminal of each NAND circuit with an output terminal of the NAND circuit of the previous stage thereof. A second path is a path (a bypass path) to which a signal output from the NAND circuit NAND[13] is transmitted through a signal line which connects the output terminal of the NAND circuit NAND[13] with an input terminal of the NAND circuit NAND[16]. The signal transmitted through the second path reaches the NAND circuit NAND[16] by bypassing the NAND circuits NAND[14] and NAND[15] without passing through the NAND circuits NAND[14] and NAND[15] on the first path. By the above configuration, a feed forward loop is formed and thus the so-called "asymmetric oscillation circuit" is configured.

Next, an operation of the circuit illustrated in FIG. 12 will be described. FIG. 13 illustrates waveforms of the start pulse StartP and the lower phase signals (phase signals CK[0] to CK[16]) from the VCO 1100. The horizontal direction of FIG. 13 represents time and the vertical direction of FIG. 13 represents voltage. First, a logic state of the start pulse StartP is changed from an L (low) state to an H (high) state, such that the VCO 1100 starts a transition operation. In the transition operation, the logic states of the phase signals output from the NAND circuits constituting the VCO 1100 are changed in order. Simultaneously when the VCO 1100 starts the transition operation, the count unit 1105 starts a count and a reference signal generation unit (not illustrated) starts to generate a ramp wave (a reference signal). The ramp wave generated by the reference signal generation unit is a signal of which the level increases or decreases in one direction over time.

The analog signal and the ramp wave which are targets of the AD conversion are input to a comparison unit (not illustrated). In parallel with this, the phase signals CK[0] to CK[15] are input to the latch unit 1108 and the phase signal CK[15] is input to the count unit 1105 through the latch unit 1108. At the timing at which voltages of the analog signal and the ramp wave input to the comparison unit are substantially the same, a comparison output CO of the comparison unit is inverted. At this time, the latch unit 1108 latches the logic state corresponding to the lower phase signals CK[0] to CK[15] and the count unit 1105 latches a count value (an upper count value). The lower phase signals (phase signals CK[0] to CK[15]) latched by the latch unit 1108 are encoded (binarized) by the detection circuit 1107 and the encoding circuit 1106 and thus become lower data of digital data, and the upper count value latched by the count unit 1105 becomes upper data of the digital data. Thereby, digital data corresponding to the level of the analog signal is obtained.

For encoding the lower phase signals, for example, it is preferable to detect whether the logic states of two phase signals are predetermined states in time series while changing the phase signal of a comparison target (for example, see Japanese Unexamined Patent Application, First Publication No. 2012-191269). Specifically, a method of detecting that the logic states of the two lower phase signals output from the two NAND circuits are the predetermined logic states, for example, "01" (L state and H state), is performed in time series.

SUMMARY OF THE INVENTION

According to a first aspect of the present invention, an imaging apparatus includes: an imaging unit in which a plurality of pixels, each of which has a photoelectric conversion element and is configured to output a pixel signal, are disposed in a matrix of M (M is a natural number greater than or equal to 2) rows by N (N is a natural number greater than or equal to 2) columns; a reference signal generation unit configured to generate a reference signal which increases or decreases over time; a comparison unit configured to compare the pixel signal to the reference signal and end a comparison process at a timing at which the reference signal satisfies a predetermined condition with respect to the pixel signal; a clock generation unit having a plurality of delay units and configured to generate a plurality of phase signals having phases different from each other based on signals output from the plurality of delay units; a signal transmission unit provided to correspond to the plurality of phase signals and having a plurality of signal transmission circuits configured to transmit the plurality of phase signals; and a latch unit having a plurality of latch circuits configured to latch the plurality of phase signals transmitted by the signal transmission unit at the timing of an end of the comparison process. The plurality of signal transmission circuits have main buffer circuits. A configuration of the signal transmission circuit that transmits a first phase signal which is any one of the plurality of phase signals is substantially the same as a configuration of the signal transmission circuit that transmits a second phase signal which is any one of the plurality of phase signals and is different from the first phase signal. A configuration of the latch circuit that latches the first phase signal is substantially the same as a configuration of the latch circuit that latches the second phase signal.

According to a second aspect of the present invention, in the imaging apparatus according to the first aspect of the present invention, the plurality of signal transmission circuits may include: a first circuit configured to transmit a third phase signal which is any one of the plurality of phase signals; a second circuit configured to be substantially the same as the first circuit and configured to transmit the third phase signal; and a phase blend circuit configured to blend the third phase signal transmitted by the first circuit and the third phase signal transmitted by the second circuit.

According to a third aspect of the present invention, in the imaging apparatus according to the first or second aspect of the present invention, the plurality of latch circuits may include: a logic circuit to which the plurality of phase signals transmitted by the signal transmission unit are input; and a main body circuit configured to latch a signal output from the logic circuit.

According to a fourth aspect of the present invention, in the imaging apparatus according to any one of the first to third aspects of the present invention, the plurality of signal transmission circuits may have sub-buffer circuits disposed at a subsequent stage side of the main buffer circuits and a previous stage side of the plurality of latch circuits on a path through which the plurality of phase signals are transmitted.

DETAILED DESCRIPTION OF THE INVENTION

Hereinafter, embodiments of the present invention will be described with reference to the accompanying drawings.
(First Embodiment)

Figure 1:
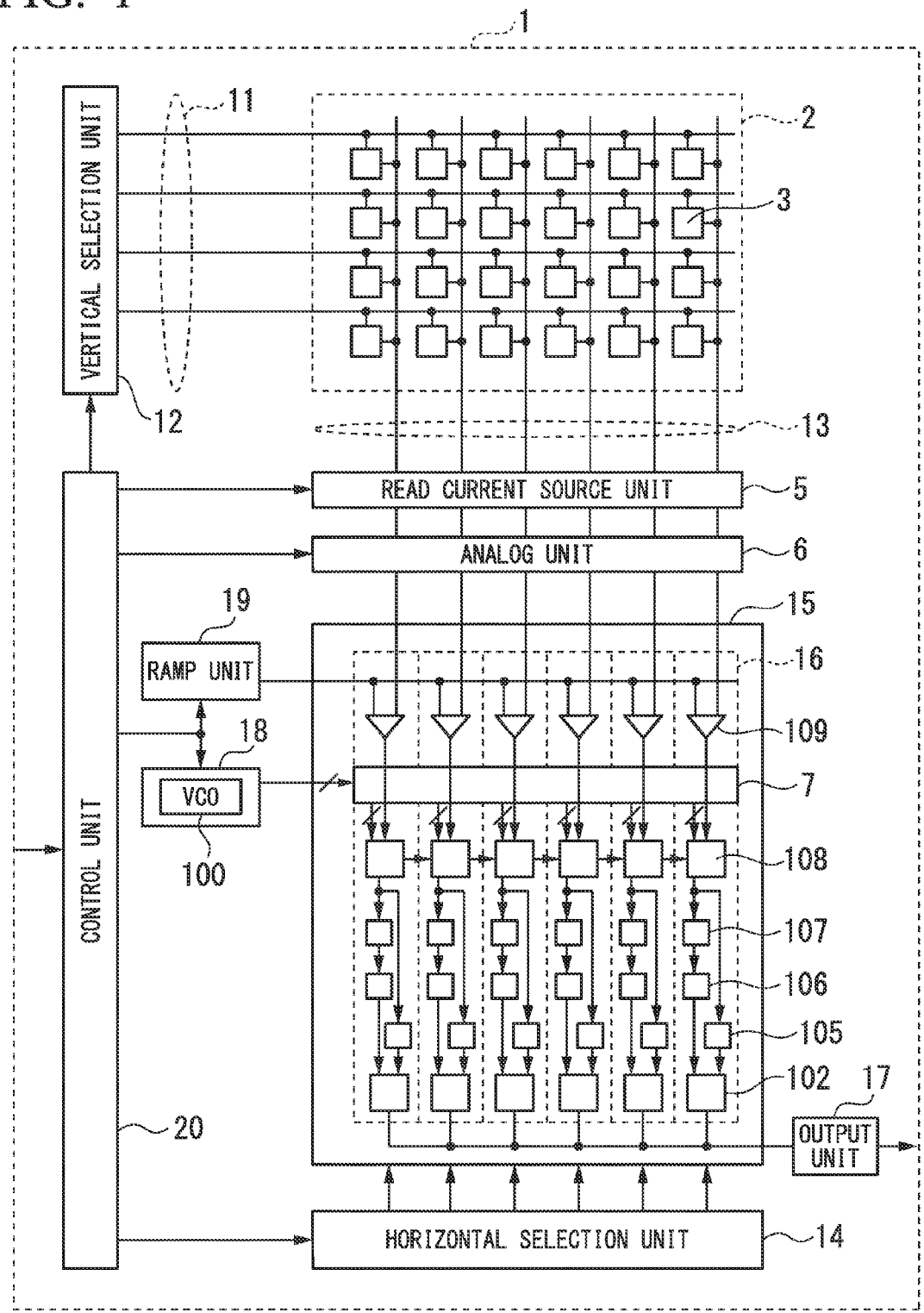
FIG. 1 is a block diagram illustrating a configuration of an imaging apparatus according to a first embodiment of the present invention.

First, the first embodiment of the present invention will be described. FIG. 1 illustrates an example of a configuration of an imaging apparatus according to this embodiment. The imaging apparatus 1 illustrated in FIG. 1 includes an imaging unit 2, a vertical selection unit 12, a read current source unit 5, an analog unit 6, a signal transmission unit 7, a clock generation unit 18, a ramp unit 19, a column processing unit 15, a horizontal selection unit 14, an output unit 17, and a control unit 20.

The imaging unit 2 includes a plurality of unit pixels 3 disposed in a matrix, wherein the unit pixel 3 is a pixel which generates and outputs a signal corresponding to the amount of an incident electromagnetic wave. The vertical selection unit 12 selects rows of the imaging unit 2. The read current source unit 5 reads a signal from the imaging unit 2 as a voltage signal. The analog unit 6 performs analog processing such as amplification on a pixel signal read from the imaging unit 2. The clock generation unit 18 generates and outputs a lower phase signal which is a clock of a predetermined frequency. The ramp unit 19 generates a reference signal (ramp wave) which increases or decreases over time.

The column processing unit 15 has a column AD conversion unit 16 configured to perform AD conversion on a pixel signal processed by the analog unit 6. The signal transmission unit 7 transmits a lower phase signal output from the clock generation unit 18 to the column AD conversion unit 16. The horizontal selection unit 14 reads AD converted digital data to a horizontal signal line. The output unit 17 is connected to the horizontal signal line. The control unit 20 controls each unit.

Although the case of the imaging unit 2 including unit pixels 3 of 4 rows×6 columns has been described for simplicity in FIG. 1, it is only necessary for the number of rows and the number of columns of the array of the unit pixels 3 to be an arbitrary natural number greater than or equal to 2. In reality, tens to hundreds of thousands of unit pixels 3 are disposed in each row or each column of the imaging unit 2. Although not illustrated, the unit pixel 3 constituting the imaging unit 2 includes a photoelectric conversion element, such as a photodiode, a photo gate, a photo transistor or the like, and a transistor circuit.

Hereinafter, each unit will be described in further detail. The imaging unit 2 includes the unit pixels 3 two-dimensionally disposed in only 4 rows×6 columns. In addition, each row control line 11 is wired for every row in the pixel array of the 4 rows×6 columns. The end of each row control line 11 is connected to an output terminal of a corresponding row of the vertical selection unit 12. The vertical selection unit 12 includes a shift register, a decoder, or the like, and controls row addressing and row scanning of the imaging unit 2 through the row control line 11 at the time of driving each unit pixel 3 of the imaging unit 2. In addition, a vertical signal line 13 is wired to each column in the pixel array of the imaging unit 2. That is, the imaging unit 2 has a plurality of unit pixels 3 disposed in a matrix, and outputs a pixel signal via the vertical signal line 13 connected to the unit pixel 3 arranged in the vertical direction among the plurality of unit pixels 3.

The read current source unit 5, for example, includes an n-channel metal-oxide semiconductor (NMOS) transistor. The NMOS transistor constituting the read current source unit 5 includes a drain terminal connected to the vertical signal line 13 from the imaging unit 2, a gate terminal to which a desired voltage is appropriately applied, and a source terminal connected to the ground (GND). Thereby, a pixel signal from the unit pixel 3 is read in a voltage mode. Although the case in which the NMOS transistor is used as a current source has been described, it is unnecessary to limit the present invention thereto.

The column processing unit 15, for example, includes column AD conversion units 16 provided for each pixel column of the imaging unit 2, that is, for every vertical signal line 13. The column AD conversion unit 16 converts an analog pixel signal read via the vertical signal line 13 for every column from each unit pixel 3 of the imaging unit 2 into digital data. The column AD conversion unit 16 is disposed in a column unit corresponding to one column of the pixel array of the imaging unit 2. Although the column AD conversion units 16 are disposed in a one-to-one correspondence relationship with respect to one column of the pixel array of the imaging unit 2 in this example, this is only an example and the present invention is not limited to this layout relationship. For example, it is also possible to adopt a configuration in which one column AD conversion unit 16 is disposed for a plurality of columns of a pixel array of the imaging unit 2 and the one column AD conversion unit 16 is used in time division among a plurality of columns. The column processing unit 15 constitutes an AD conversion means (AD conversion circuit) which converts an analog pixel signal read from the unit pixel 3 of a selected row of the imaging unit 2 into digital pixel data along with the ramp unit 19 and the clock generation unit 18 as will be described later.

The ramp unit 19, for example, includes an integration circuit and generates a so-called ramp wave of which a level varies with time in an inclined pattern and supplies the ramp wave to the column AD conversion unit 16 via the reference signal line in accordance with control of the control unit 20. The ramp unit 19 is not limited to a configuration using an integration circuit as the ramp unit 19, but a digital-to-analog converter (DAC) circuit may be used as the ramp unit 19. However, when a configuration of digitally generating the ramp wave using the DAC circuit is adopted, it is necessary to make a step of the ramp wave fine or adopt a configuration equivalent thereto.

Figure 12:
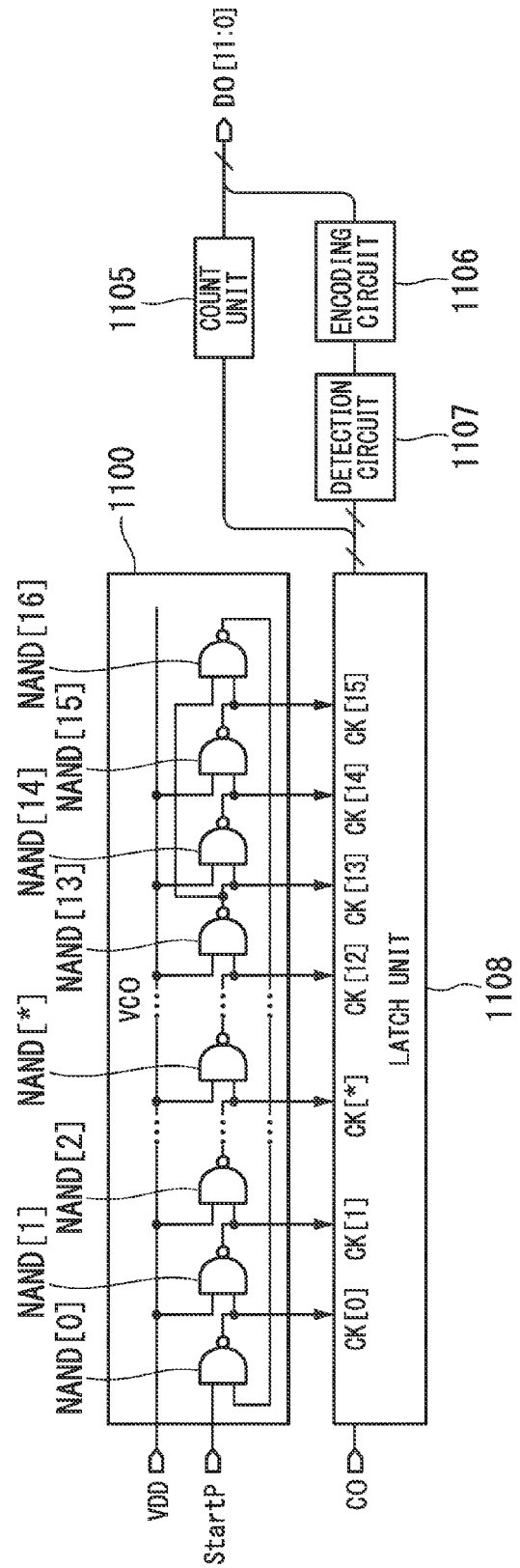
FIG. 12 is a block diagram illustrating a configuration of part of a conventional AD conversion circuit.
Figure 13:
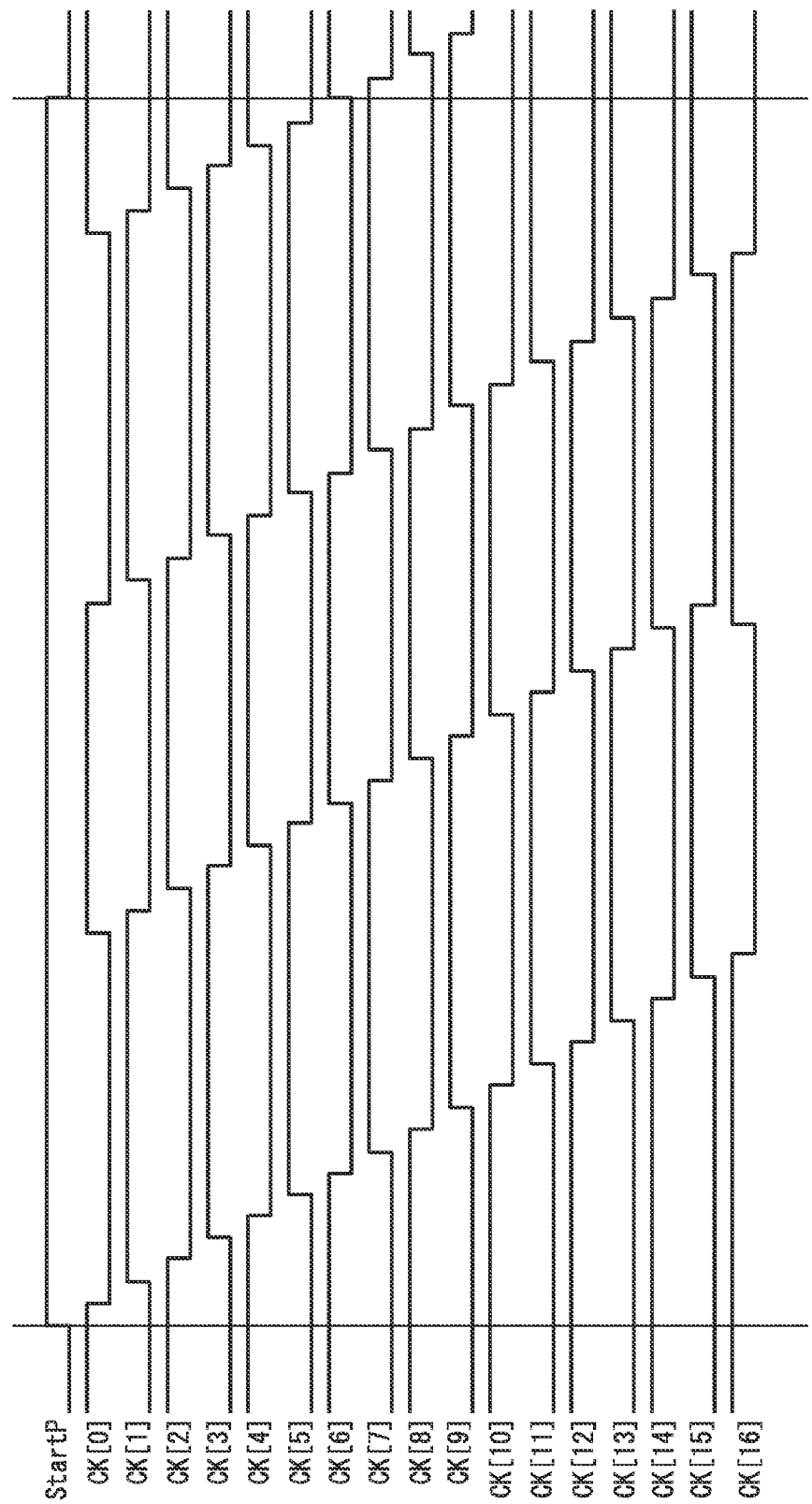
FIG. 13 is a timing chart illustrating waveforms of phase signals.

The clock generation unit 18 includes a VCO 100 which is a ring delay circuit in which a plurality of delay units (inverting elements) are connected in a ring shape. Like the VCO 1100 illustrated in FIG. 12, for example, the VCO 100 is a so-called "asymmetric oscillation circuit" which includes an odd number of delay units. Therefore, the clock generation unit 18 has a plurality of delay units and generates a plurality of phase signals having phase signals different from each other based on signals output from the plurality of delay units. This is only an example and the present invention is not limited to the above configuration. Phase signals output by the plurality of delay units constituting the VCO 100 constitute a lower phase signal.

The signal transmission unit 7 has a plurality of signal transmission circuits provided to correspond to each of the plurality of phase signals output from the clock generation unit 18 and configured to transmit the phase signals. In this example, a 16-bit signal transmission circuit is provided to correspond to a 16-bit phase signal output from the clock generation unit 18. Details of the signal transmission circuit constituting the signal transmission unit 7 will be described later.

The horizontal selection unit 14 includes a shift register, a decoder, or the like, and controls the column addressing and the column scanning of the column AD conversion unit 16 of the column processing unit 15. In accordance with the control of the horizontal selection unit 14, the digital data obtained by AD conversion of the column AD conversion unit 16 is read to the horizontal signal line in order.

The output unit 17 outputs binarized digital data. In addition, the output unit 17, for example, may incorporate a signal processing function such as black level adjustment, column variation correction, and color processing in addition to a buffering function. Further, the output unit 17 may convert n-bit parallel digital data into serial data to output the serial data.

The control unit 20 includes a functional block of a timing generator (TG) which supplies clock signals or predetermined timing pulse signals necessary for operation units such as the ramp unit 19, the clock generation unit 18, the vertical selection unit 12, the horizontal selection unit 14, the output unit 17, and the like, and a functional block for communicating with the TG.

Next, a configuration of the column AD conversion unit 16 will be described. The column AD conversion unit 16 compares the analog pixel signal read via the vertical signal line 13 from each unit pixel 3 of the imaging unit 2 to the ramp wave for AD conversion supplied from the ramp unit 19 to generate a pulse signal having a magnitude (pulse width) in a time axis direction corresponding to the magnitude of the pixel signal. Then, the column AD conversion unit 16 performs the AD conversion by converting the data corresponding to a period of the pulse width of the pulse signal into the digital data corresponding to the magnitude of the pixel signal.

Hereinafter, the configuration of the column AD conversion unit 16 will be described in detail. The column AD conversion unit 16 is disposed for every column of the pixel array of the imaging unit 2. In FIG. 1, six column AD conversion units 16 are disposed. The column AD conversion units 16 of the columns have the same configuration. The column AD conversion unit 16 includes the comparison unit 109, a latch unit 108, a count unit 105, a detection circuit 107, an encoding circuit 106, and a calculation unit 102.

The comparison unit 109 compares a signal voltage corresponding to the analog pixel signal output via the vertical signal line 13 from the unit pixel 3 of the imaging unit 2 to a ramp voltage of the ramp wave supplied from the ramp unit 19 to convert the magnitude of the pixel signal into information (the pulse width of the pulse signal) in the time axis direction. A comparison output of the comparison unit 109, for example, becomes a low level (L level) when the ramp voltage is greater than the signal voltage and becomes a high level (H level) when the ramp voltage is less than or equal to the signal voltage. The comparison unit 109 ends a comparison process at the timing at which the ramp wave satisfies a predetermined condition with respect to a pixel signal (the timing at which voltages of the analog signal and the ramp wave are substantially consistent in this example). At the timing at which the comparison unit 109 ends the comparison process, a comparison output of the comparison unit 109 is inverted.

The latch unit 108 includes a plurality of latch circuits which latch (hold/store) a lower phase signal transmitted by the signal transmission unit 7 at the timing of the end of the comparison process by the comparison unit 109. The latch unit 108 outputs one (in this example, a lower phase signal CK[15]) of a plurality of phase signals constituting the lower phase signal output from the clock generation unit 18 to the count unit 105 without change until the comparison output of the comparison unit 109 is inverted. In addition, the latch unit 108 latches the lower phase signal output from the clock generation unit 18 at the timing at which the comparison output of the comparison unit 109 is inverted. Details of a latch circuit constituting the latch unit 108 will be described later.

The count unit 105 includes a counter circuit which acquires a count value (upper count value) by counting one phase signal (in this example, the phase signal CK[15]) output via the latch unit 108 as a count clock. The count unit 105 obtains upper bit data (upper data) constituting the digital data by performing a count operation.

Herein, the lower phase signal latched in the latch unit 108, for example, is 16-bit data. In addition, the upper data signal constituted by a count value of the count unit 105, for example, is 8-bit data. The 8 bits are an example and the number of bits (for example, 10 bits) exceeding 8 bits, or the like, may be used.

The detection circuit 107 sequentially compares two phase signals constituting the lower phase signal latched in the latch circuit of the latch unit 108 to detect a predetermined logic state and output a detection result. The encoding circuit 106 performs encoding based on the detection result output from the detection circuit 107 and determines an encoded value. Thereby, the lower phase signal is encoded and data (lower data) of lower bits constituting digital data is obtained.

The calculation unit 102 has a counter circuit which performs subtraction (correlated double sampling (CDS) process). For example, after a digital value held in the encoding circuit 106 and the count unit 105 by encoding a first pixel signal is set as an initial value of the counter circuit of the calculation unit 102, the counter circuit of the calculation unit 102 performs the subtraction (CDS process) by performing a count process (count) based on a digital value held in the encoding circuit 106 and the count unit 105 through the encoding of a second pixel signal.

Next, an operation of this example will be described. Here, although the description of a specific operation of the unit pixel 3 is omitted, a reset level and a signal level are output from the unit pixel 3 as is well known.

The AD conversion is performed as follows. For example, the comparison unit 109 compares the voltage of the ramp wave which falls at a predetermined slope to the voltage of the analog signal from the analog unit 6. In a period from when the comparison process has started to when the voltage of the analog signal matches the voltage (the ramp voltage) of the ramp wave, the count unit 105 counts one phase signal constituting the lower phase signal output via the latch unit 108. Further, the detection circuit 107 detects the logic state of the lower phase signal latched in the latch unit 108. The encoding circuit 106 encodes a detection result, thereby obtaining the digital data corresponding to the magnitude of the analog signal.

Here, a reset level including noise of a pixel signal is read in a first read operation as an analog pixel signal from each unit pixel 3 of a selected row of the imaging unit 2, and then a signal level is read in a second read operation. Then, the reset level and the signal level are input to the AD conversion unit 16 via the vertical signal line 13 in time series. The signal level may be read in the first read operation, and then the reset level may be read in the second read operation. Hereinafter, details of the first and second read operations and encoding (binarization process) and subtraction (CDS processing) will be described.

<First Read>

First, after a pixel signal (reset level) output from the unit pixel 3 of an arbitrary row of the pixel array of the imaging unit 2 to the vertical signal line 13 is stabilized, the control unit 20 supplies the ramp unit 19 with control data for generating a ramp wave. In response to the control data, the ramp unit 19 outputs a ramp wave, which has a waveform temporally varying in a ramp shape as a whole, as a comparison voltage to be applied to one input terminal of the comparison unit 109. The comparison unit 109 compares the ramp wave to the analog signal from the analog unit 6. In this period, the count unit 105 performs counting using the phase signal CK[15] output from one latch circuit of the latch unit 108 as a count clock. Although it is preferable that the timing of an output start of the lower phase signal of the clock generation unit 18 be substantially simultaneous with the timing of the output start of the ramp wave, the present invention is not limited thereto.

The comparison unit 109 compares the voltage of the ramp wave applied from the ramp unit 19 to the voltage of the analog signal from the analog unit 6 and inverts a comparison output when the two voltages substantially match. At this timing, the latch circuit of the latch unit 108 is in a disable state, and the latch unit 108 latches logic states of the phase signals CK[0] to CK[15] output from the clock generation unit 18. In addition, when the latch circuit of the latch unit 108 stops the output of the phase signal CK[15], the count unit 105 latches the count value. When a predetermined period has elapsed, the control unit 20 stops the supply of the control data to the ramp unit 19 and the output of the lower phase signal from the clock generation unit 18. Thereby, the ramp unit 19 stops the generation of the ramp wave.

Subsequently, the encoding of the phase signals CK[0] to CK[15] held in the latch unit 108 is performed and the encoded value is latched in the encoding circuit 106. The encoded value latched in the encoding circuit 106 and the count values latched in the count unit 105 are output to the calculation unit 102. An initial value based on the count values is set in the calculation unit 102.

<Second Read>

Subsequently, during the second read, a signal level corresponding to an amount of incident light of each unit pixel 3 is read and a similar operation to the first read is performed. After a pixel signal (signal level) output from the unit pixel 3 of an arbitrary pixel row of the pixel array of the imaging unit 2 to the vertical signal line 13 is stabilized, the control unit 20 supplies the ramp unit 19 with control data for generating a ramp wave. In response to the control data, the ramp unit 19 outputs a ramp wave, which has a waveform temporally varying in a ramp shape as a whole, as a comparison voltage to be applied to one input terminal of the comparison unit 109. The comparison unit 109 compares the ramp wave to the analog signal from the analog unit 6. In this period, the count unit 105 performs counting using the phase signal CK[15] output from one latch circuit of the latch unit 108 as a count clock. Although it is preferable that the timing of an output start of the lower phase signal of the clock generation unit 18 be substantially simultaneous with the timing of the output start of the ramp wave, the present invention is not limited thereto.

The comparison unit 109 compares the voltage of the ramp wave applied from the ramp unit 19 to the voltage of the analog signal from the analog unit 6 and inverts a comparison output when the two voltages substantially match. At this timing, the latch circuit of the latch unit 108 is in a disable state, and the latch unit 108 latches logic states of the phase signals CK[0] to CK[15] output from the clock generation unit 18. In addition, when the latch circuit of the latch unit 108 stops the output of the phase signal CK[15], the count unit 105 latches the count value. When a predetermined period has elapsed, the control unit 20 stops the supply of the control data to the ramp unit 19 and the output of the lower phase signal from the clock generation unit 18. Thereby, the ramp unit 19 stops the generation of the ramp wave.

Subsequently, the encoding of the phase signals CK[0] to CK[15] held in the latch unit 108 is performed and the encoded value is latched in the encoding circuit 106. Based on the encoded value latched in the encoding circuit 106 and the count value latched in the count unit 105, the calculation unit 102 performs subtraction. Thereby, subtraction (CDS process) of first digital data based on the reset level and second digital data based on the signal level is performed.

As described above, digital data corresponding to a difference between the reset level and the signal level is obtained. Finally, the digital data held in the calculation unit 102 is transmitted to the output unit 17 via the horizontal signal line by the horizontal selection unit 14.

The analog unit 6 may perform the subtraction (CDS process) of the reset level and the signal level, and the column AD conversion unit 16 may perform AD conversion on the analog signal after subtraction (CDS process).

Figure 2:
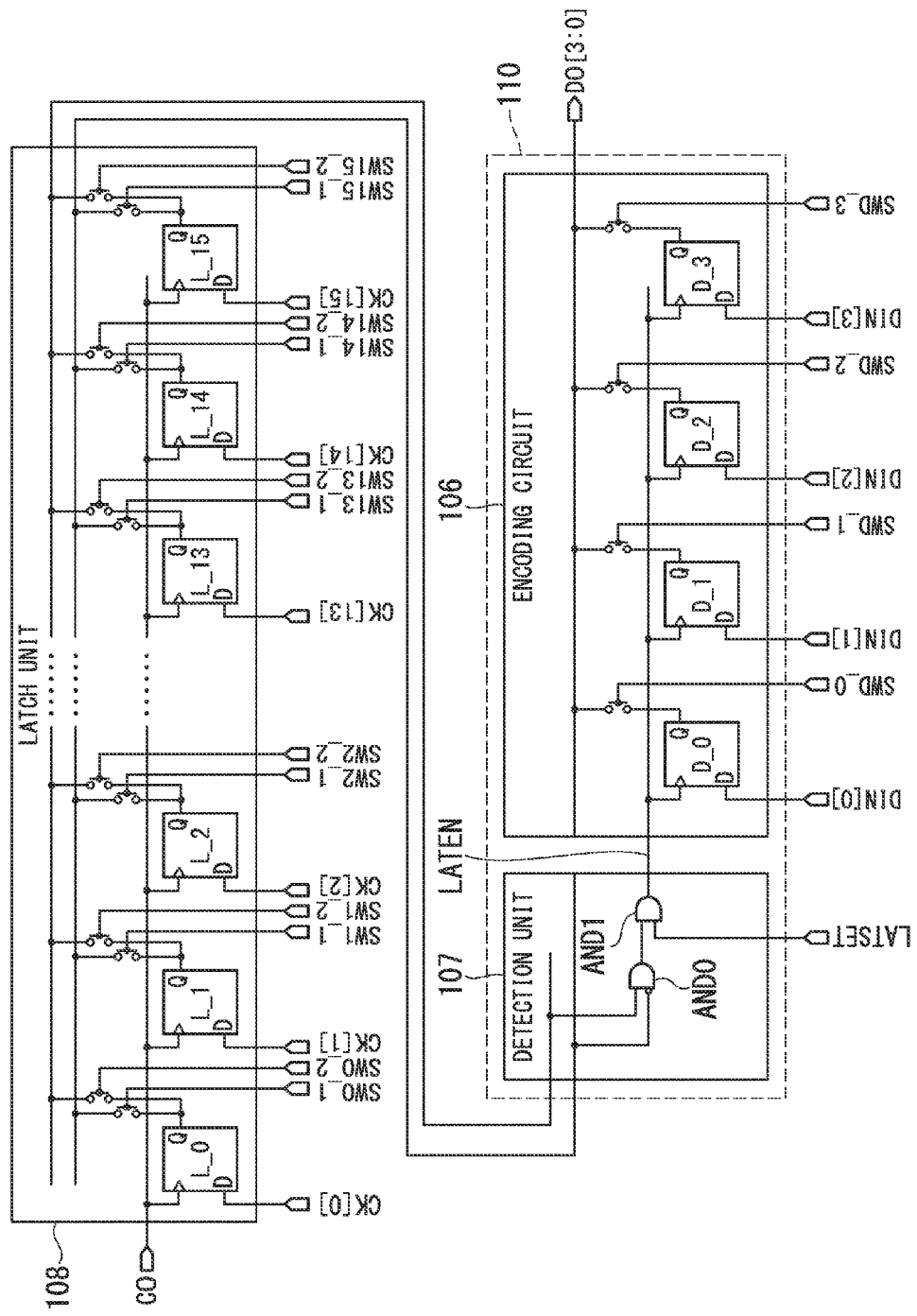
FIG. 2 is a circuit diagram illustrating a configuration of a latch unit, a detection circuit, and an encoding circuit constituting a column AD conversion unit provided in the imaging apparatus according to the first embodiment of the present invention.

Next, details of the latch unit 108, the detection circuit 107, and the encoding circuit 106 will be described. FIG. 2 illustrates a configuration of the latch unit 108, the detection circuit 107, and the encoding circuit 106.

The latch unit 108 has latch circuits L_0 to L_15 for latching logic states of the phase signals CK[0] to CK[15] at a point in time at which the comparison output CO from the comparison unit 109 has been inverted. Control signals SW0_1 to SW15_1 and SW0_2 to SW15_2 are signals which control a switch for outputting a predetermined phase signal from the phase signals CK[0] to CK[15] latched in the latch circuits L_0 to L_15 to the detection circuit 107.

The detection circuit 107 has AND circuits AND0 and AND1. A phase signal output from any one of the latch circuits L_0 to L_15 and a signal obtained by inverting the phase signal output from any other one of the latch circuits L_0 to L_15 are input to the AND circuit AND0. The AND circuit AND0 performs an AND operation on the two input signals. An output signal of the AND circuit AND0 and a control signal LATSET are input to the AND circuit AND1. The AND circuit AND1 performs an AND operation on the two input signals, and outputs a result thereof as a detection result LATEN (state detection signal) of a predetermined logic state.

The encoding circuit 106 has encoding latch circuits D_0 to D_3. Encoded values DIN[0] to DIN[3] sequentially vary depending on a combination of two phase signals to be sequentially compared by the detection circuit 107. Every time the combination of the two phase signals input to the detection circuit 107 varies, the encoded values DIN[0] to DIN[3] input to the encoding circuit 106 vary. In addition, the encoded values DIN[0] to DIN[3] when a predetermined logic state is detected are held as encoding results of the phase signals CK[0] to CK[15] and output as output signals DO[0] to DO[3]. Control signals SWD_0 to SWD_3 are signals which control the switch for outputting encoded values from the latch circuits D_0 to D_3. The detection circuit 107 and the encoding circuit 106 constitute the encoding unit 110. These are examples, and the present invention is not necessarily limited thereto.

By the control signals SW0_1 to SW15_1 and SW0_2 to SW15_2, two latch circuits are selected from among the latch circuits L_0 to L_15 in which the phase signals CK[0] to CK[15] are held. Phase signals from the two selected latch circuits are input to the detection circuit 107 and logic states of the input phase signals are detected. When the result of the AND operation by the AND circuit AND0 becomes an H state, the encoded values DIN[0] to DIN[3] input to the encoding circuit 106 become the encoding result.

Figure 3:
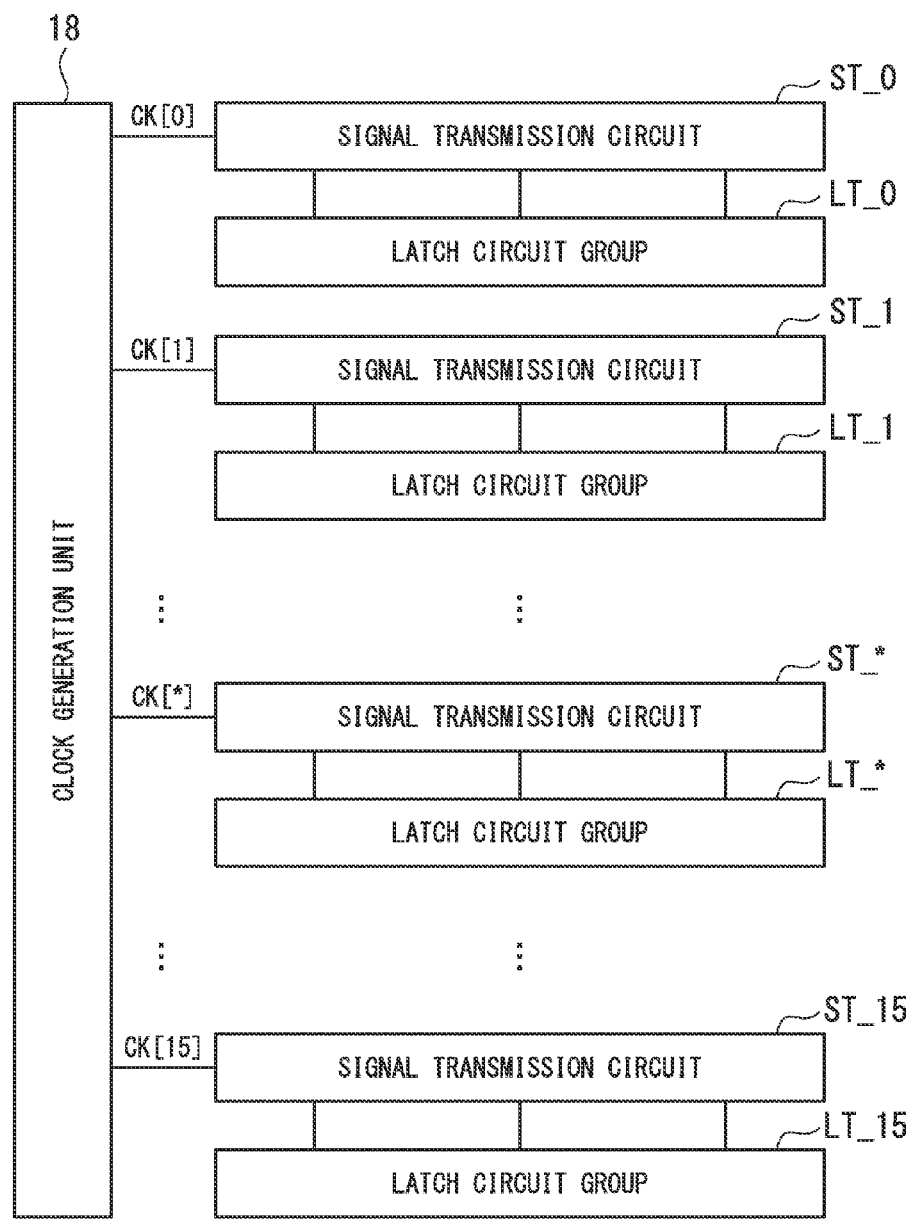
FIG. 3 is a block diagram illustrating a correspondence relationship between a signal transmission circuit and a latch circuit group provided in the imaging apparatus according to the first embodiment of the present invention.

Next, details of the signal transmission unit 7 and the latch unit 108 will be described. FIG. 3 illustrates a correspondence relationship between the signal transmission circuit provided in the signal transmission unit 7 and the latch circuit group including a plurality of latch circuits provided in the latch unit 108.

The signal transmission unit 7 has a plurality of signal transmission circuits ST_0, ST_1, ..., ST_*, ..., ST_15 provided to correspond to a plurality of phase signals constituting a lower phase signal output from the clock generation unit 18. Because 16 phase signals are output in this example, 16 signal transmission circuits are provided. Each signal transmission circuit transmits one corresponding phase signal. Specifically, the signal transmission circuit ST_* transmits a phase signal CK[*] (* is any of 0 to 15).

All latch circuits included in the latch units 108 provided in the six column AD conversion units 16 are shown as latch circuit groups LT_0, LT_1, LT_*, LT_15.

One latch circuit group has latch circuits for latching the same phase signal. Specifically, the latch circuit group LT_* has six latch circuits L_* provided in the six column AD conversion units 16 (* is any of 0 to 15).

One latch circuit group is disposed to correspond to one signal transmission circuit. Each latch circuit group latches a phase signal transmitted by a corresponding signal transmission circuit. Specifically, the latch circuit group LT_* latches a phase signal CK[*] transmitted by the signal transmission circuit ST_* (* is any of 0 to 15).

Figure 4:
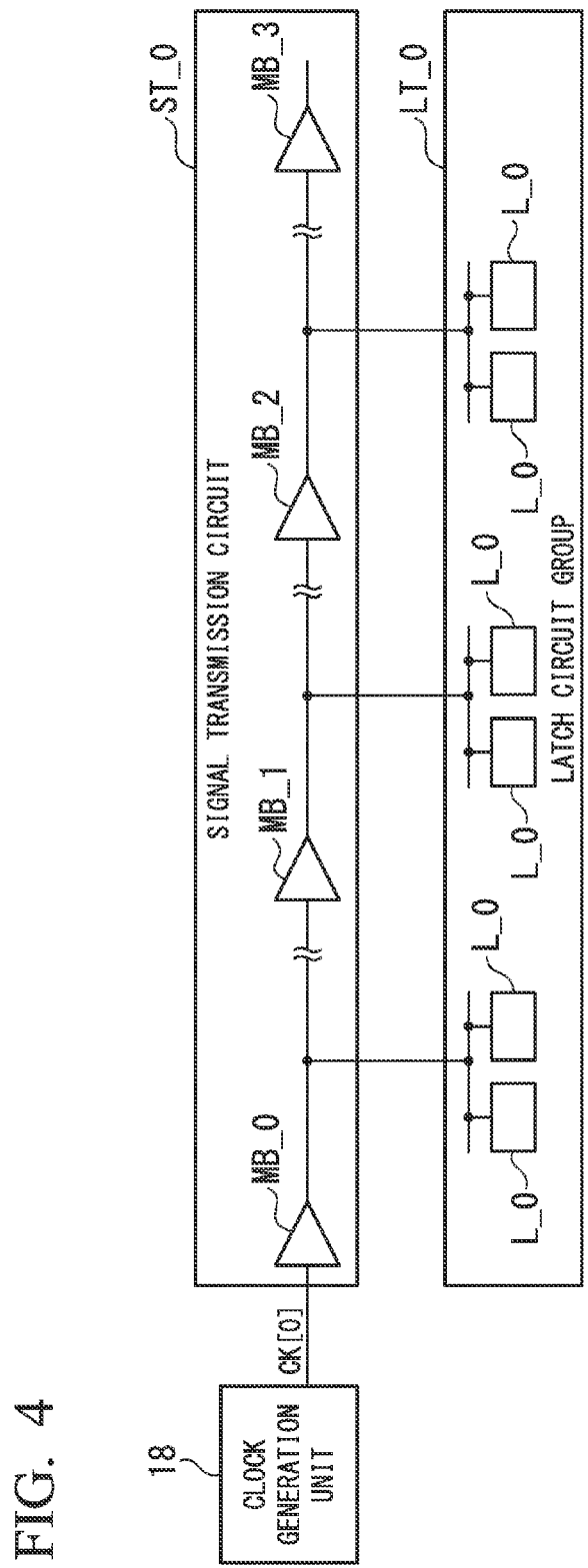
FIG. 4 is a block diagram illustrating a configuration of the signal transmission circuit and the latch circuit group provided in the imaging apparatus according to the first embodiment of the present invention.

FIG. 4 illustrates an example of configurations of one signal transmission circuit ST_0 and one latch circuit group LT_0. The signal transmission circuit ST_0 has a plurality of main buffer circuits MB_0, MB_1, MB_2, and MB_3 disposed on a path through which a phase signal CK[0] is transmitted. These main buffer circuits shape the waveform of the phase signal CK[0]. The latch circuit group LT_0 has six latch circuits L_0 provided in the six column AD conversion units 16.

In the signal transmission circuit ST_0, a path through which the phase signal CK[0] output from the clock generation unit 18 is transmitted is configured in a wiring layer extending in one predetermined direction. The one predetermined direction is a direction (for example, a horizontal direction) in which the latch circuit L_0 corresponding to each column of the pixel array of the imaging unit 2 is arranged. The main buffer circuits MB_0, MB_1, MB_2, and MB_3 are disposed on this path.

In FIG. 4, the main buffer circuit is disposed for every two columns of the pixel array of the imaging unit 2. It is desirable that the main buffer circuit be disposed for every plurality of columns (for example, 128 columns) of the pixel array of the imaging unit 2. For example, when the number of columns of the pixel array of the imaging unit 2 is 5000, about 40 to 50 main buffer circuits are disposed. The main buffer circuit may be disposed for every column of the pixel array of the imaging unit 2.

In FIG. 4, two latch circuits L_0 are connected between two main buffer circuits adjacent on the path through which the phase signal CK[0] is transmitted. Specifically, two latch circuits L_0 corresponding to first and second columns of the pixel array of the imaging unit 2 are connected between the main buffer circuit MB_0 and the main buffer circuit MB_1. In addition, two latch circuits L_0 corresponding to third and fourth columns of the pixel array of the imaging unit 2 are connected between the main buffer circuit MB_1 and the main buffer circuit MB_2. In addition, two latch circuits L_0 corresponding to fifth and sixth columns of the pixel array of the imaging unit 2 are connected between the main buffer circuit MB_2 and the main buffer circuit MB_3.

When the number of columns of the pixel array of the imaging unit 2 is 5000, 5000 latch circuits L_0 are connected. It is desirable that the latch circuit L_0 be disposed in the vicinity of a path through which the phase signal CK[0] is transmitted. In addition, although not illustrated, a comparison output or the like from the comparison unit 109 is input to each latch circuit L_0.

The signal transmission circuits ST_1 to ST_15 have substantially the same configuration as the signal transmission circuit ST_0. Specifically, a first signal transmission circuit, which is any one of the signal transmission circuits ST_0 to ST_15 and transmits a first phase signal, has substantially the same configuration as a second signal transmission circuit, which is any one of the signal transmission circuits ST_0 to ST_15 and transmits a second phase signal different from the first phase signal. Hereinafter, conditions that are satisfied when the first signal transmission circuit has substantially the same configuration as the second signal transmission circuit will be described. The following conditions are satisfied for an arbitrary combination of the first and second signal transmission circuits.

The first and second signal transmission circuits have the same number of main buffer circuits. In addition, in the first and second signal transmission circuits, the configurations of the main buffer circuits disposed at positions corresponding to the same column of the pixel array of the imaging unit 2 are substantially the same. For example, the main buffer circuit MB_0 of the first signal transmission circuit has substantially the same configuration as the main buffer circuit MB_0 of the second signal transmission circuit, the main buffer circuit MB_1 of the first signal transmission circuit has substantially the same configuration as the main buffer circuit MB_1 of the second signal transmission circuit, the main buffer circuit MB_2 of the first signal transmission circuit has substantially the same configuration as the main buffer circuit MB_2 of the second signal transmission circuit, and the main buffer circuit MB_3 of the first signal transmission circuit has substantially the same configuration as the main buffer circuit MB_3 of the second signal transmission circuit.

Although it is desirable that the configurations of the plurality of main buffer circuits provided in one signal transmission circuit be substantially the same, the configurations may be different. For example, the configuration of the main buffer circuit MB_0 may be different from that of the main buffer circuit MB_1.

In addition, the number of latch circuits connected between two main buffer circuits adjacent on the path through which the first phase signal is transmitted in the first signal transmission circuit is substantially the same as the number of latch circuits connected between two main buffer circuits, which are adjacent on the path through which the second phase signal is transmitted, disposed at positions corresponding to the two main buffer circuits of the first signal transmission circuit in the second signal transmission circuit. For example, the number of latch circuits connected between the main buffer circuit MB_0 and the main buffer circuit MB_1 in the first signal transmission circuit is substantially the same (two) as the number of latch circuits connected between the main buffer circuit MB_0 and the main buffer circuit MB_1 in the second signal transmission circuit. The number of latch circuits connected between the main buffer circuit MB_1 and the main buffer circuit MB_2 is also substantially the same as the number of latch circuits connected between the main buffer circuit MB_2 and the main buffer circuit MB_3.

Although it is desirable that the number of latch circuits connected between the two main buffer circuits adjacent on the path through which the phase signal is transmitted be substantially the same for any two adjacent main buffer circuits in one signal transmission circuit, the numbers may be different. For example, the number of latch circuits connected between the main buffer circuit MB_01 and the main buffer circuit MB_1 may be different from the number of latch circuits connected between the main buffer circuit MB_1 and the main buffer circuit MB_2.

In addition, the latch circuit groups LT_1 to LT_15 have substantially the same configuration as the latch circuit group LT_0. Specifically, the configuration of the first latch circuit for latching the first phase signal transmitted by the first signal transmission circuit may be substantially the same as the configuration of the second latch circuit for latching the second phase signal transmitted by the second signal transmission circuit. Hereinafter, conditions that are satisfied when the first latch circuit has substantially the same configuration as the second latch circuit will be described. The following conditions are satisfied for an arbitrary combination of the first and second latch circuits.

Configurations of the first and second latch circuits disposed at positions corresponding to the same column of the pixel array of the imaging unit 2 are substantially the same. For example, the configurations of the latch circuit L_0 for latching the phase signal CK[0] and the latch circuit L1 for latching the phase signal CK[1] disposed at positions corresponding to the same column of the pixel array of the imaging unit 2 are substantially the same.

Although it is desirable that configurations of the plurality of latch circuits for latching the same phase signal be substantially the same, the configurations may be different. For example, in the plurality of latch circuits L_0 for latching the phase signal CK[0], the latch circuit L_0 disposed at the position corresponding to the first column of the pixel array of the imaging unit 2 and the latch circuit L_0 disposed at the position corresponding to the second column of the pixel array of the imaging unit 2 may be different.

Figure 5:
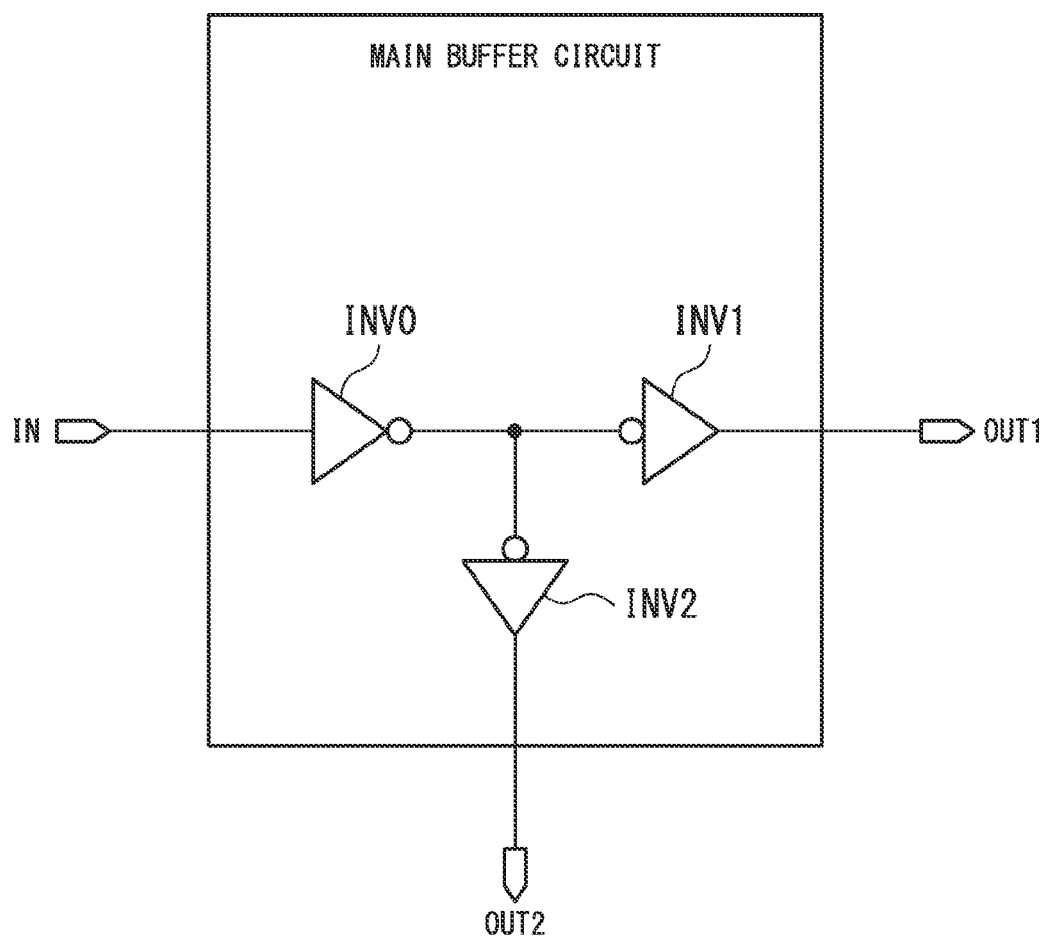
FIG. 5 is a circuit diagram illustrating a configuration of a main buffer circuit provided in the imaging apparatus according to the first embodiment of the present invention.

Next, details of the configuration of the main buffer circuit will be described. FIG. 5 illustrates an example of the configuration of an arbitrary main buffer circuit among the main buffer circuits MB_0, MB_1, MB_2, and MB_3. The main buffer circuit illustrated in FIG. 5 has three inverter circuits INV0 to INV2.

The inverter circuit INV0 inverts the input signal IN which is a phase signal input from the previous stage main buffer circuit or the clock generation unit 18 and outputs the inverted signal. The inverter circuit INV1 inverts the signal output from the inverter circuit INV0 and outputs the inverted signal as an output signal OUT1 to a subsequent stage main buffer circuit. The inverter circuit INV2 inverts the signal output from the inverter circuit INV0 to output the inverted signal as an output signal OUT2 to the subsequent stage latch circuit. These are examples, and the present invention is not necessarily limited thereto.

Figure 6:
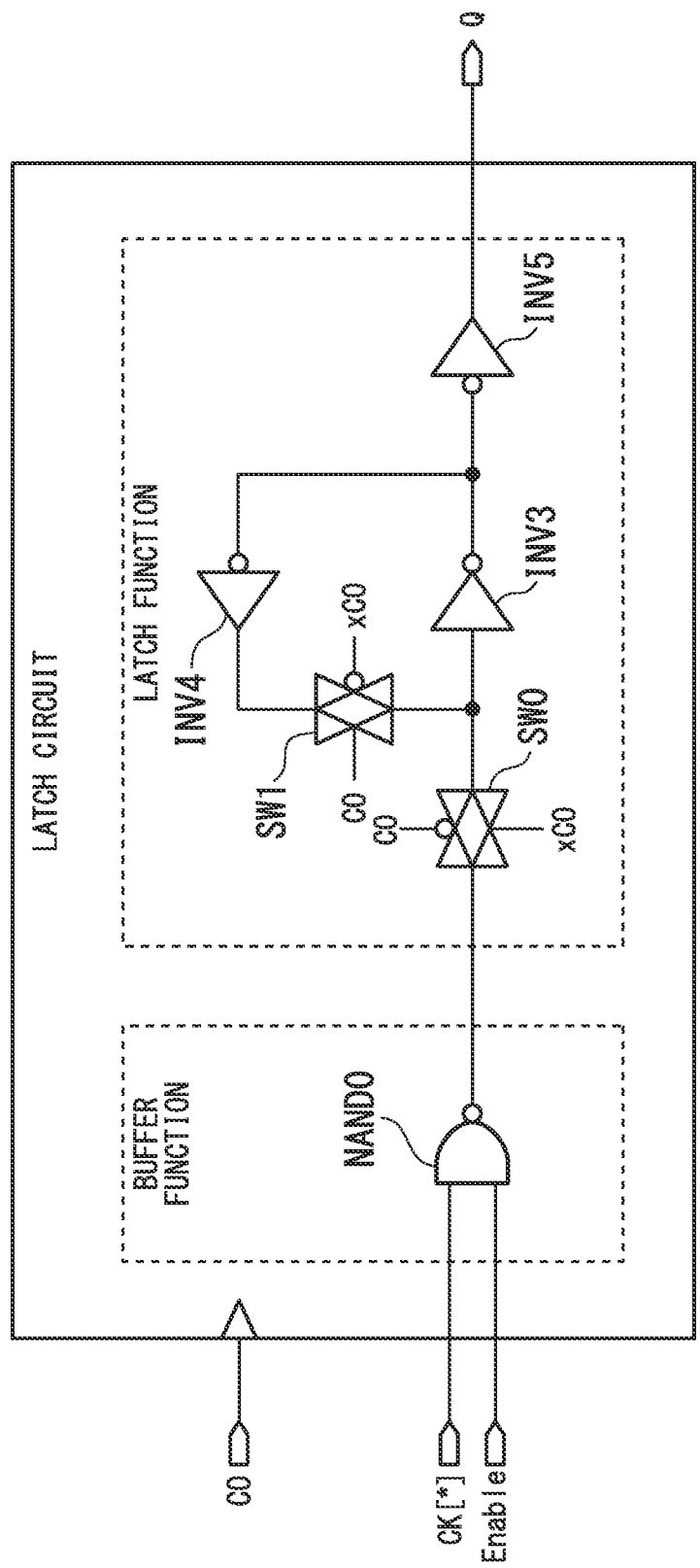
FIG. 6 is a circuit diagram illustrating a configuration of a latch circuit provided in the imaging apparatus according to the first embodiment of the present invention.

Next, details of the configuration of the latch circuit will be described. FIG. 6 illustrates an example of a configuration of an arbitrary latch circuit among the latch circuits L_0 to L_15. The latch circuit illustrated in FIG. 6 has a logic circuit having a buffer function and to which a phase signal transmitted by the signal transmission unit 7 is input, and a main body circuit having a latch function and configured to latch a signal output from the logic circuit.

The logic circuit having the buffer function has a NAND circuit NAND0 having one input terminal to which the phase signal CK[*] (* is any of 0 to 15) is input and the other input terminal to which a control signal Enable is input. Here, a "logic circuit having a buffer function" refers to a logic circuit (for example, an inverter circuit, a NAND circuit, a NOR circuit, or the like) capable of activating a subsequent stage element (in this example, switch elements SW0 and SW1 and an inverter circuit INV3 provided in the main body circuit) at a desired frequency. The logic of the logic circuit may be appropriately selected. In this example, when the control signal Enable is in the H state, the logic state of the phase signal CK[*] is transmitted to the main body circuit. These are examples, and the present invention is not necessarily limited thereto.

The main body circuit having a latch function has the switch elements SW0 and SW1 to which the comparison output CO from the comparison unit 109 and an inverted comparison output xCO which is a signal obtained by inverting the comparison output CO are input, and inverter circuits INV3 to INV5. The switch element SW0 outputs a signal output from the NAND circuit NAND0. The inverter circuit INV3 inverts a signal output from the switch element SW0 and outputs the inverted signal. The inverter circuit INV4 inverts a signal output from the inverter circuit INV3 and outputs the inverted signal. The switch element SW1 outputs a signal output from the inverter circuit INV4. The inverter circuit INV5 inverts the signal output from the inverter circuit INV3 and outputs the inverted signal as an output signal Q.

The switch element SW0 is an element obtained by connecting a p-channel metal-oxide semiconductor (PMOS) transistor having a gate terminal to which the comparison output CO is input and an NMOS transistor having a gate terminal to which the inverted comparison output xCO is input in parallel. When the comparison output CO is in an L state and the inverted comparison output xCO is in an H state, the switch element SW0 is turned on. When the comparison output CO is in the H state and the inverted comparison output xCO is in the L state, the switch element SW0 is turned off.

The switch element SW1 is an element obtained by connecting an NMOS transistor having a gate terminal to which the comparison output CO is input and a PMOS transistor having a gate terminal to which the inverted comparison output xCO is input in parallel. When the comparison output CO is in the H state and the inverted comparison output xCO is in the L state, the switch element SW1 is turned on. When the comparison output CO is in the L state and the inverted comparison output xCO is in the H state, the switch element SW1 is turned off.

Because the switch element SW0 is turned on and the switch element SW1 is turned off when the comparison output CO is in the L state and the inverted comparison output xCO is in the H state, the phase signal CK[*] input to the latch circuit is output from the latch circuit. In addition, because the switch element SW0 is turned off and the switch element SW1 is turned on when the comparison output CO is in the H state and the inverted comparison output xCO is in the L state, the logic state of the phase signal CK[*] input to the latch circuit is latched in the latch circuit. These are examples, and the present invention is not limited thereto.

When no logic circuit is provided, the load in terms of the main buffer circuit becomes the load of the switch elements SW0 and SW1 and the input load of the inverter circuit INV3. When the logic circuit is provided, the load in terms of the main buffer circuit becomes only the input load of the NAND circuit NAN D0. By reducing the load in terms of the main buffer circuit, the occurrence of phase noise having low time dependency due to load variation is reduced. Further, the occurrence of the phase noise (jitter noise) having high time dependency is suppressed by reducing the number of main buffer circuits within a range in which predetermined waveform shaping is implemented.

According to this embodiment, an imaging apparatus includes: an imaging unit 2 in which a plurality of pixels (unit pixels 3), each of which has a photoelectric conversion element and is configured to output a pixel signal, are disposed in a matrix of M (M is a natural number greater than or equal to 2) rows by N (N is a natural number greater than or equal to 2) columns; a reference signal generation unit (ramp unit 19) configured to generate a reference signal (ramp wave) which increases or decreases over time; a comparison unit 109 configured to compare the pixel signal to the reference signal and end a comparison process at a timing at which the reference signal satisfies a predetermined condition with respect to the pixel signal; a clock generation unit 18 having a plurality of delay units and configured to generate a plurality of phase signals having phases different from each other based on signals output from the plurality of delay units; a signal transmission unit 7 provided to correspond to the plurality of phase signals and having a plurality of signal transmission circuits configured to transmit the plurality of phase signals; and a latch unit 108 having a plurality of latch circuits configured to latch the plurality of phase signals transmitted by the signal transmission unit 7 at the timing of an end of the comparison process. The plurality of signal transmission circuits have main buffer circuits MB_0, MB_1, MB_2, and MB_3. A configuration of the signal transmission circuit that transmits a first phase signal which is any one of the plurality of phase signals is substantially the same as a configuration of the signal transmission circuit that transmits a second phase signal which is any one of the plurality of phase signals and is different from the first phase signal. A configuration of the latch circuit that latches the first phase signal is substantially the same as a configuration of the latch circuit that latches the second phase signal.

Because configurations of a plurality of signal transmission circuits are substantially the same, capabilities of the signal transmission circuits to shape phase signal waveforms are substantially the same. In addition, because configurations of a plurality of latch circuits for latching different phase signals are substantially the same, loads for the signal transmission paths are substantially the same. Thus, it is possible to reduce the occurrence of variation of the phase difference among a plurality of phase signals and prevent image quality from deteriorating due to a transmission error.

In addition, according to this embodiment, in the image apparatus, the latch circuit includes a logic circuit to which a phase signal transmitted by the signal transmission unit 7 is input, and a main body circuit configured to latch a signal output from the logic circuit. Thereby, it is possible to reduce driving load of the main buffer circuit.

(Second Embodiment)

Next, the second embodiment of the present invention will be described. An imaging apparatus according to this embodiment has a signal transmission circuit illustrated in FIG. 7 in place of a signal transmission circuit constituting the signal transmission unit 7 in the imaging apparatus 1 illustrated in FIG. 1.

Figure 7:
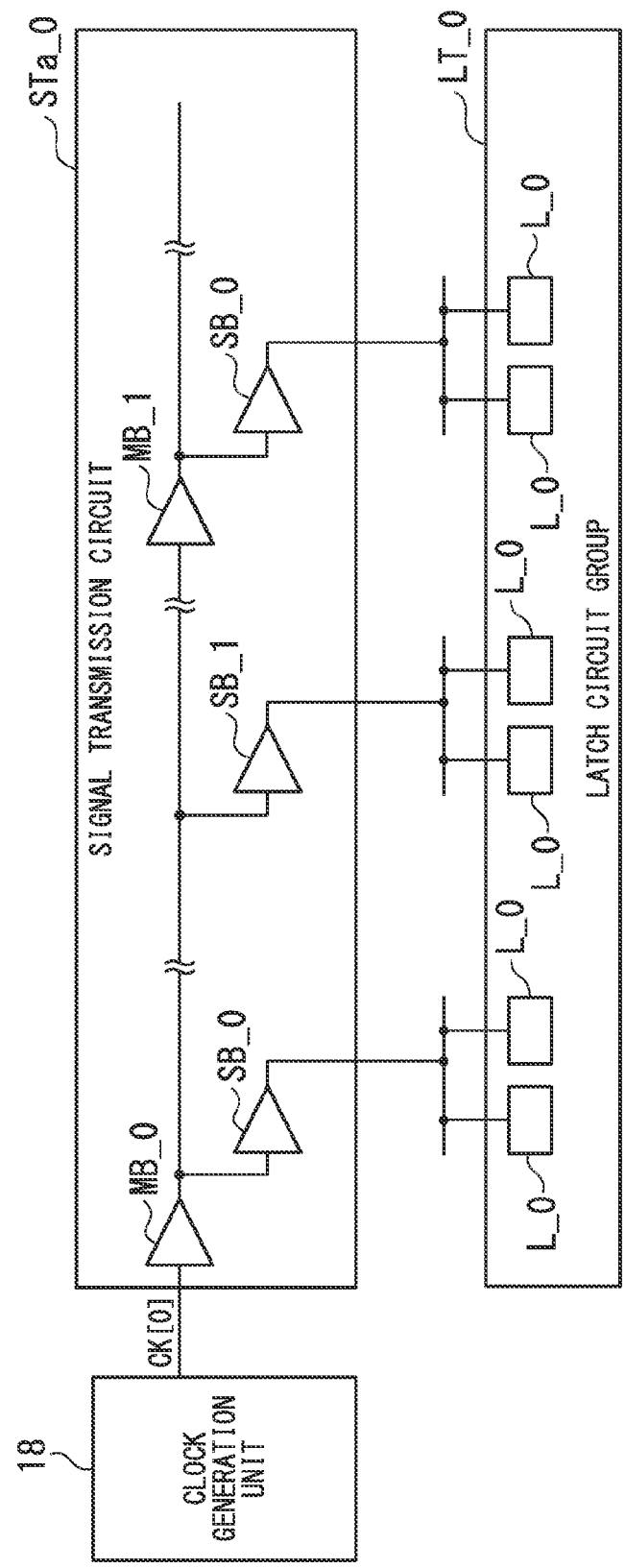
FIG. 7 is a block diagram illustrating configurations of a signal transmission circuit and a latch circuit group provided in an imaging apparatus according to a second embodiment of the present invention.

FIG. 7 illustrates an example of configurations of one signal transmission circuit STa_0 and one latch circuit group LT_0. The signal transmission circuit STa_0 has a plurality of main buffer circuits MB_0, MB_1, . . . disposed on a path through which a phase signal CK[0] is transmitted, and a plurality of sub-buffer circuits SB_0, SB_1, . . . connected to the path through which the phase signal CK[0] is transmitted. These main buffer circuits and sub-buffer circuits shape the waveform of the phase signal CK[0]. The latch circuit group LT_0 has six latch circuits L_0 provided in the six column AD conversion units 16.

In the signal transmission circuit STa_0, a path through which the phase signal CK[0] output from the clock generation unit 18 is transmitted is configured in a wiring layer extending in one predetermined direction. The one predetermined direction is a direction (for example, a horizontal direction) in which the latch circuit L_0 corresponding to each column of the pixel array of the imaging unit 2 is arranged. The main buffer circuits MB_0, MB_1, . . . are disposed on this path.

In FIG. 7, the main buffer circuit is disposed for every plurality of columns (for example, 128 columns) of the pixel array of the imaging unit 2. For example, when the number of columns of the pixel array of the imaging unit 2 is 5000, about 40 to 50 main buffer circuits are disposed. As described in the first embodiment, the main buffer circuit may be disposed for every column of the pixel array of the imaging unit 2.

A path through which the phase signal CK[0] is transmitted is branched into a path for the next main buffer circuit and a path for each sub-buffer circuit on a subsequent stage side of each main buffer circuit. The sub-buffer circuits SB_0, SB_1, . . . are disposed at the subsequent stage side of any main buffer circuit and the previous stage side of the latch circuit L_0 on the path through which the phase signal CK[0] is transmitted. In FIG. 7, a plurality (for example, 8) of sub-buffer circuits are connected between two main buffer circuits adjacent on the path through which the phase signal CK[0] is transmitted.

In addition, a plurality of latch circuits L_0 are connected to the sub-buffer circuits SB_0, SB_1, . . . . As an example, when the main buffer circuit is disposed for every 128 columns of the pixel array of the imaging unit 2 and eight sub-buffer circuits are disposed in one main buffer circuit, sixteen latch circuits L_0 are connected to one sub-buffer circuit.

When the number of columns of the pixel array of the imaging unit 2 is 5000, 5000 latch circuits L_0 are connected. It is desirable that the latch circuit L_0 be disposed in the vicinity of a path through which the phase signal CK[0] is transmitted. In addition, although not illustrated, a comparison output or the like from the comparison unit 109 is input to each latch circuit L_0.

Even in this embodiment, a first signal transmission circuit configured to transmit a first phase signal has substantially the same configuration as a second signal transmission circuit configured to transmit a second phase signal different from the first phase signal. Hereinafter, conditions that are satisfied when the first signal transmission circuit has substantially the same configuration as the second signal transmission circuit will be described. The following conditions are satisfied for an arbitrary combination of the first and second signal transmission circuits.

As in the first embodiment, the first and second signal transmission circuits have the same number of main buffer circuits. In addition, as in the first embodiment, in the first and second signal transmission circuits, the configurations of the main buffer circuits disposed at positions corresponding to the same column of the pixel array of the imaging unit 2 are substantially the same.

Although it is desirable that the configurations of the plurality of main buffer circuits provided in one signal transmission circuit be substantially the same, the configurations may be different. For example, the configuration of the main buffer circuit MB_0 may be different from that of the main buffer circuit MB_1.

In addition, the first and second signal transmission circuits have the same number of sub-buffer circuits. Further, in the first and second signal transmission circuits, configurations of sub-buffer circuits disposed at positions corresponding to the same column of the pixel array of the imaging unit 2 are substantially the same. For example, a configuration of the sub-buffer circuit SB_0 of the first signal transmission circuit is substantially the same as that of the sub-buffer circuit SB_0 of the second signal transmission circuit.

Although it is desirable that configurations of the plurality of sub-buffer circuits provided in one signal transmission circuit be substantially the same, the configurations may be different. For example, the configurations of the sub-buffer circuits SB_0 and SB_1 may be different.

In addition, the number of sub-buffer circuits connected between two main buffer circuits adjacent on the path through which the first phase signal is transmitted in the first signal transmission circuit is substantially the same as the number of sub-buffer circuits connected between two main buffer circuits, which are adjacent on the path through which the second phase signal is transmitted, disposed at positions corresponding to the two main buffer circuits of the first signal transmission circuit in the second signal transmission circuit. For example, the number of sub-buffer circuits connected between the main buffer circuit MB_0l and the main buffer circuit MB_1 in the first signal transmission circuit is substantially the same (for example, 8) as the number of sub-buffer circuits connected between the main buffer circuit MB_0l and the main buffer circuit MB_1 in the second signal transmission circuit.

Although it is desirable that the number of sub-buffer circuits connected between the two main buffer circuits adjacent on the path through which the phase signal is transmitted be substantially the same for any two adjacent main buffer circuits in one signal transmission circuit, the numbers may be different. For example, the number of sub-buffer circuits connected between the main buffer circuit MB_0l and the main buffer circuit MB_1 may be different from the number of sub-buffer circuits connected between the main buffer circuit MB_1 and the main buffer circuit MB_2 (not illustrated).

In addition, the number of latch circuits connected to a sub-buffer circuit on the path through which the first phase signal is transmitted in the first signal transmission circuit is substantially the same as the number of latch circuits connected to a sub-buffer circuit, which is on the path through which the second phase signal is transmitted, disposed at a position corresponding to the sub-buffer circuit of the first signal transmission circuit in the second signal transmission circuit. For example, the number of latch circuits connected to the sub-buffer circuit SB_0 in the first signal transmission circuit is substantially the same (for example, 16) as the number of latch circuits connected to the sub-buffer circuit SB_0 in the second signal transmission circuit.

Although it is desirable that the number of latch circuits connected to the sub-buffer circuit be substantially the same for any sub-buffer circuit in one signal transmission circuit, the numbers may be different. For example, the number of latch circuits connected to the sub-buffer circuit SB_0 may be different from the number of latch circuits connected to the sub-buffer circuit SB_1.

In addition, as in the first embodiment, the configuration of the first latch circuit configured to latch the first phase signal transmitted by the first signal transmission circuit is substantially the same as the configuration of the second latch circuit configured to latch the second phase signal transmitted by the second signal transmission circuit. It is easy to optimize the number of buffer circuits so that the driving capabilities of a load become predetermined driving capabilities using the above-described configuration.

When no sub-buffer circuit is provided, the load in terms of the main buffer circuit is an input load of NAND circuits NAND0 of 128 columns. When the sub-buffer circuit is provided, the load in terms of the main buffer circuit becomes an input load of eight sub-buffer circuits, and the load in terms of the sub-buffer circuit becomes an input load of NAND circuits NAND0 of sixteen columns. In this manner, by reducing the load of the buffer circuit, the occurrence of phase noise having low time dependency due to load variation is reduced. Further, the occurrence of the phase noise (jitter noise) having high time dependency is suppressed by optimizing the number of buffer circuits within a range in which predetermined waveform shaping is implemented.

According to this embodiment, in the imaging apparatus, the plurality of signal transmission circuits have sub-buffer circuits SB_0, SB_1, . . . disposed at a subsequent stage side of the main buffer circuits and a previous stage side of the plurality of latch circuits on a path through which the plurality of phase signals are transmitted.

By optimizing the number of buffer circuits and the driving capability, it is possible to further reduce the load of each buffer circuit. As a result, it is possible to further reduce the occurrence of variation of the phase difference among a plurality of phase signals and prevent image quality from deteriorating due to a transmission error.

(Third Embodiment)

Next, the third embodiment of the present invention will be described. An imaging apparatus according to this embodiment has a signal transmission circuit illustrated in FIG. 8 in place of a signal transmission circuit constituting the signal transmission unit 7 in the imaging apparatus 1 illustrated in FIG. 1.

Figure 8:
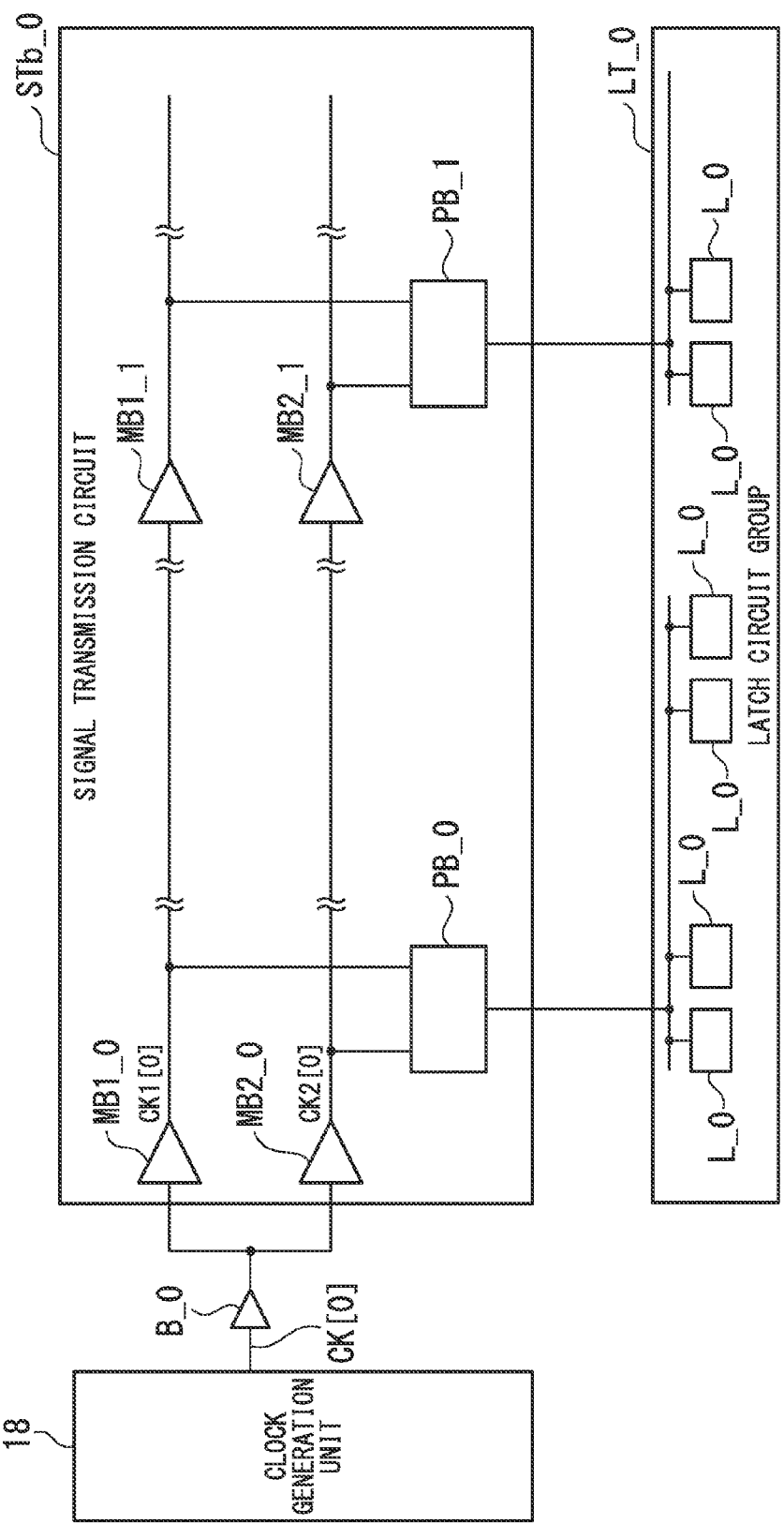
FIG. 8 is a block diagram illustrating configurations of a signal transmission circuit and a latch circuit group provided in an imaging apparatus according to a third embodiment of the present invention.

FIG. 8 illustrates an example of a configuration of one signal transmission circuit STb_0 and one latch circuit group LT_0. The signal transmission circuit STb_0 has a plurality of first main buffer circuits MB1_0, MB1_1, . . . disposed on a path through which a phase signal CK[0] is transmitted, a plurality of second main buffer circuits MB2_0, MB2_1, . . . disposed on the path through which the phase signal CK[0] is transmitted, and a plurality of phase blend circuits PB_0, PB_1, . . . connected to the path through which the phase signal CK[O] is transmitted. The first main buffer circuit shapes the waveform of the phase signal CK1[0], and the second main buffer circuit shapes the waveform of the phase signal CK2[0]. The latch circuit group LT_0 has six latch circuits L_0 provided in the six column AD conversion units 16.

The phase signal CK[0] output from the clock generation unit 18 is input to the buffer circuit B_0, and the phase signal CK[0] output from the buffer circuit B_0 is divided into the phase signal CK1[0] and the phase signal CK2[0]. The phase signals CK1[0] and CK2[0] are input to the signal transmission circuit STb_0. Although the phase signal CK[0] output from the clock generation unit 18 is input to the signal transmission circuit STb_0 via the buffer circuit B_0 in FIG. 8, no buffer circuit B_0 may be disposed.

In the signal transmission circuit STb_0, a first path through which the phase signal CK1[0] is transmitted and a second path through which the phase signal CK2[0] is transmitted are configured in a wiring layer extending in one predetermined direction. The one predetermined direction is a direction (for example, a horizontal direction) in which the latch circuit L_0 corresponding to each column of the pixel array of the imaging unit 2 is arranged. The first main buffer circuits MB1_0, MB1_1, . . . are disposed on the first path, and the second main buffer circuits MB2_0, MB2_1, . . . are disposed on the second path.

In FIG. 8, the first and second main buffer circuits are disposed for every plurality of columns (for example, 128 columns) of the pixel array of the imaging unit 2. For example, when the number of columns of the pixel array of the imaging unit 2 is 5000, about 40 to 50 first and second main buffer circuits are disposed. The first and second main buffer circuits may be disposed for every column of the pixel array of the imaging unit 2.

The first main buffer circuits MB1_0, MB1_1, . . . constitute a first circuit through which the phase signal CK1[0] is transmitted. In addition, the second main buffer circuits MB2_0, MB2_1, . . . constitute a second circuit through which the phase signal CK2[0] is transmitted. The first and second circuits have substantially the same configuration. Specifically, the signal transmission circuit STb_0 has equal numbers of the first main buffer circuits and the second main buffer circuits. In addition, the configurations of the first and second main buffer circuits disposed at positions corresponding to the same column of the pixel array of the imaging unit 2 are substantially the same. For example, the configurations of the first main buffer circuit MB1_0 and the second main buffer circuit MB2_0 are substantially the same.

The path through which the phase signal CK1[0] is transmitted is branched into a path for the next first main buffer circuit and a path for each phase blend circuit at a subsequent stage side of each first main buffer circuit. In addition, the path through which the phase signal CK2[0] is transmitted is branched into a path for the next second main buffer circuit and a path for each phase blend circuit at a subsequent stage side of each second main buffer circuit. The phase blend circuits PB_0, PB_1, . . . are disposed at the subsequent stage side of the first main buffer circuit on the path through which the phase signal CK1[0] is transmitted, the subsequent stage side of the second main buffer circuit on the path through which the phase signal CK2[0] is transmitted, and the previous stage side of the latch circuit L_0. The phase blend circuits PB_0, PB_1, blend the phase signal CK1[0] transmitted by the first main buffer circuit and the phase signal CK2[0] transmitted by the second main buffer circuit. The phase blend circuits PB_0, PB_1, . . . are disposed, so that the phase noise of the phase signal CK1[0] and the phase signal CK2[0] is reduced.

In addition, a plurality of latch circuits L_0 are connected to the phase blend circuits PB_0, PB_1, . . . . For example, when the first and second main buffer circuits are disposed for every 128 columns of the pixel array of the imaging unit 2, 128 latch circuits L_0 are connected to one phase blend circuit.

When the number of columns of the imaging unit 2 is 5000, 5000 latch circuits L_0 are connected. It is desirable that the latch circuit L_0 be disposed in the vicinity of the path through which the phase signals CK1[0] and CK2[0] are transmitted. In addition, although not illustrated, a comparison output or the like from the comparison unit 109 is output to each latch circuit L_0.

A sub-buffer circuit in the second embodiment may be disposed between the first main buffer circuit and the phase blend circuit and between the second main buffer circuit and the phase blend circuit. Thereby, the load of the buffer circuit is reduced and the occurrence of phase noise having low time dependency due to load variation is reduced. In addition, the sub-buffer circuit may be disposed between the phase blend circuit and the latch circuit.

Even in this embodiment, a first signal transmission circuit configured to transmit a first phase signal has substantially the same configuration as a second signal transmission circuit configured to transmit a second phase signal different from the first phase signal. Hereinafter, conditions that are satisfied when the first signal transmission circuit has substantially the same configuration as the second signal transmission circuit will be described. The following conditions are satisfied for an arbitrary combination of the first and second signal transmission circuits.

The first and second signal transmission circuits have the same number of first main buffer circuits. In addition, in the first and second signal transmission circuits, the configurations of the first main buffer circuits disposed at positions corresponding to the same column of the pixel array of the imaging unit 2 are substantially the same. For example, the configuration of the first main buffer circuit MB1_0 of the first signal transmission circuit is substantially the same as that of the first main buffer circuit MB1_0 of the second signal transmission circuit. Likewise, the first and second signal transmission circuits have the same number of second main buffer circuits. In addition, in the first and second signal transmission circuits, the configurations of the second main buffer circuits disposed at positions corresponding to the same column of the pixel array of the imaging unit 2 are substantially the same. For example, the configuration of the second main buffer circuit MB2_0 of the first signal transmission circuit is substantially the same as that of the second main buffer circuit MB2_0 of the second signal transmission circuit.

Although it is desirable that the configurations of the plurality of first main buffer circuits provided in one signal transmission circuit be substantially the same, the configurations may be different. For example, the configuration of the first main buffer circuit MB1_0 may be different from that of the first main buffer circuit MB1_1. In addition, although it is desirable that the configurations of the plurality of second main buffer circuits provided in one signal transmission circuit be substantially the same, the configurations may be different. For example, the configuration of the second main buffer circuit MB2_0 may be different from that of the second main buffer circuit MB2_1.

The first and second signal transmission circuits have the same number of phase blend circuits. Further, in the first and second signal transmission circuits, the configurations of the phase blend circuits disposed at positions corresponding to the same column of the pixel array of the imaging unit 2 are substantially the same. For example, the configuration of the phase blend circuit PB_0 of the first signal transmission circuit is substantially the same as that of the phase blend circuit PB_0 of the second signal transmission circuit.

Although it is desirable that the configurations of the plurality of phase blend circuits provided in one signal transmission circuit be substantially the same, the configurations may be different. For example, the configuration of the phase blend circuit PB_0 may be different from that of the phase blend circuit PB_1.

In addition, the number of latch circuits connected to a phase blend circuit on the path through which the first phase signal is transmitted in the first signal transmission circuit is substantially the same as the number of latch circuits connected to a phase blend circuit, which is on the path through which the second phase signal is transmitted, disposed at a position corresponding to the phase blend circuit of the first signal transmission circuit in the second signal transmission circuit. For example, the number of latch circuits connected to the phase blend circuit PB_0 in the first signal transmission circuit is substantially the same (for example, 128) as the number of latch circuits connected to the phase blend circuit PB_0 in the second signal transmission circuit.

Although it is desirable that the number of latch circuits connected to the phase blend circuit be substantially the same for any phase blend circuit in one signal transmission circuit, the numbers may be different. For example, the number of latch circuits connected to the phase blend circuit PB_0 may be different from the number of latch circuits connected to the phase blend circuit PB_1.

In addition, as in the first embodiment, the configuration of the first latch circuit configured to latch the first phase signal transmitted by the first signal transmission circuit is substantially the same as the configuration of the second latch circuit configured to latch the second phase signal transmitted by the second signal transmission circuit.

Figure 9:
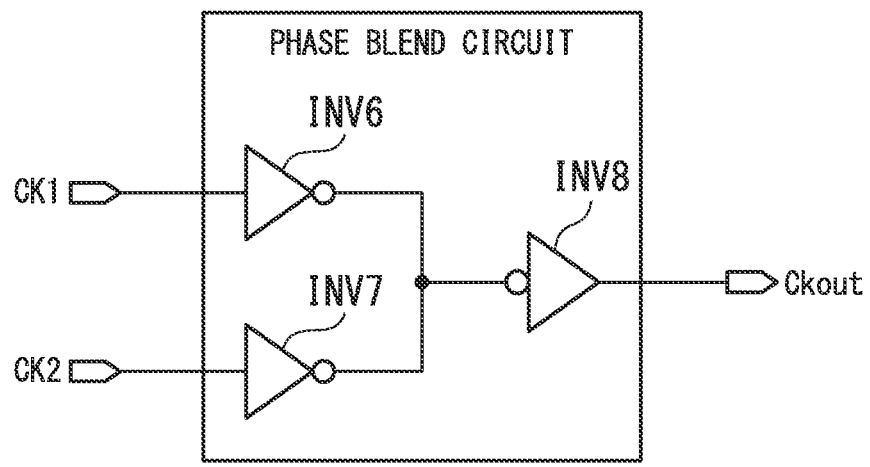
FIG. 9 is a circuit diagram illustrating a configuration of a phase blend circuit provided in the imaging apparatus according to the third embodiment of the present invention.

Next, details of the configuration of the phase blend circuit will be described. FIG. 9 illustrates an example of a configuration of an arbitrary phase blend circuit among the phase blend circuits PB_0, PB_1, . . . . The phase blend circuit illustrated in FIG. 9 has three inverter circuits INV6 to INV8.

The inverter circuit INV6 receives an input of a phase signal CK1 (corresponding to the phase signal CK1[0] of FIG. 8), inverts the input phase signal CK1, and outputs the inverted signal. The inverter circuit INV7 receives an input of a phase signal CK2 (corresponding to the phase signal CK2 [0] of FIG. 8), inverts the input phase signal CK2, and outputs the inverted signal. The inverter circuit INV8 receives an input of a signal obtained by blending a signal output from the inverter circuit INV6 and a signal output from the inverter circuit INV7, inverts the input signal, and outputs the inverted signal as an output signal Ckout. The signal obtained by blending the signals output from the inverter circuits INV6 and INV7 is input to the inverter circuit INV8, so that the signal output from the inverter circuit INV8 becomes a signal obtained by temporally averaging the signals output from the inverter circuits INV6 and INV7.

Although the phase blend circuit is configured in the inverter circuit in FIG. 9, the present invention is not necessarily limited thereto. For example, the phase blend circuit may be configured by a logic circuit such as a logical AND circuit or a logical OR circuit to which a control signal can be input. In this case, the phase blend circuit has a first logic circuit corresponding to the inverter circuit INV6, a second logic circuit corresponding to the inverter circuit INV7, and a third logic circuit corresponding to the inverter circuit INV8. It is desirable that the configurations of the first and second logic circuits be substantially the same.

Figure 10:
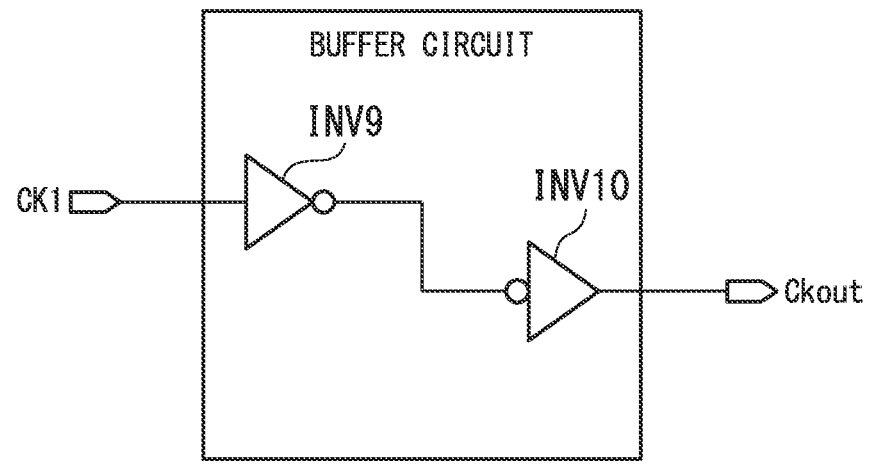
FIG. 10 is a circuit diagram illustrating a configuration of a buffer circuit to be compared to the phase blend circuit provided in the imaging apparatus according to the third embodiment of the present invention.

Next, an operation of the phase blend circuit will be described. Hereinafter, the operation of the phase blend circuit is compared to that of the buffer circuit (corresponding to the buffer circuit B_0 of FIG. 8). FIG. 10 illustrates an example of the configuration of the buffer circuit to be compared to the phase blend circuit. The buffer circuit illustrated in FIG. 10 has an inverter circuit INV9 to which the phase signal CK1 is input and which inverts the input phase signal CK1 and outputs the inverted signal, and an inverter circuit INV10 configured to invert a signal output from the inverter circuit INV9 and output the inverted signal as an output signal Ckout.

Figure 11:
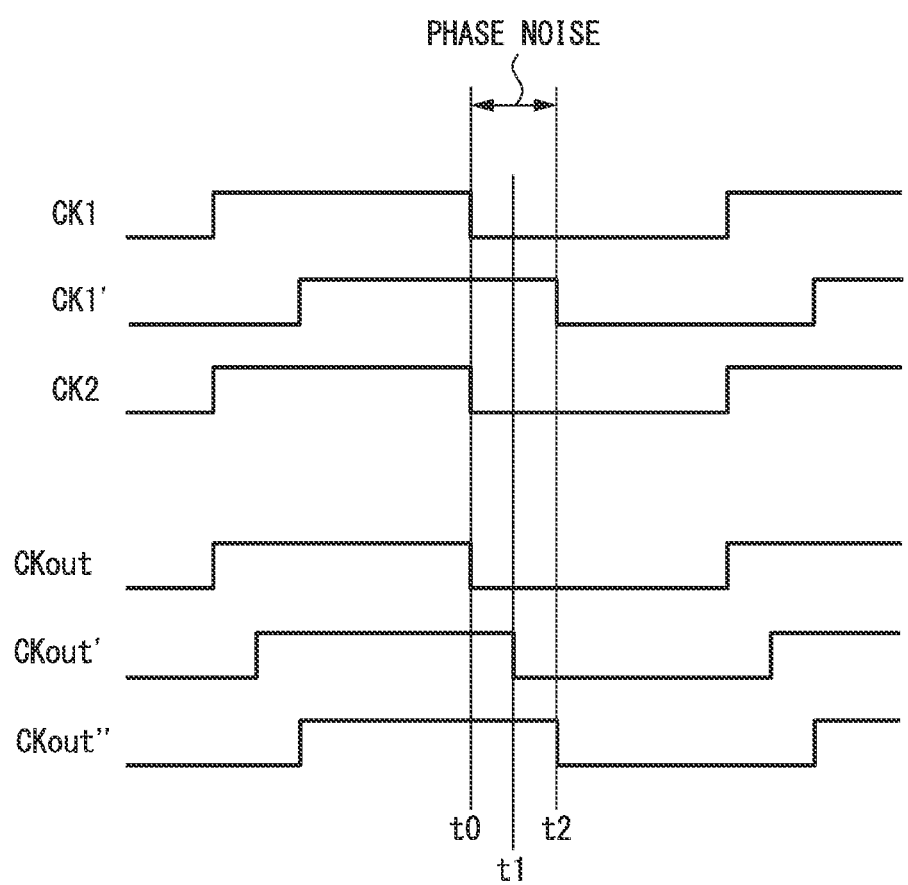
FIG. 11 is a timing chart illustrating waveforms of signals related to the phase blend circuit and the buffer circuit to be compared to the phase blend circuit provided in the imaging apparatus according to the third embodiment of the present invention.

FIG. 11 illustrates waveforms of signals related to operations of the phase blend circuit and the buffer circuit. The horizontal direction of FIG. 11 represents time and the vertical direction of FIG. 11 represents a voltage. A phase signal CK1 represents an ideal phase signal (equivalent to the phase signals CK[0] to CK[15]) on which the phase noise is not superimposed, and a phase signal CK1' represents a phase signal on which the phase noise is superimposed. For ease of description, a phase signal CK2 is handled as a signal on which no phase noise is superimposed.

The buffer circuit outputs a phase signal CKout when the phase signal CK1 is input, and outputs a phase signal CKout" when the phase signal CK1' is input. That is, the phase noise superimposed on the input signal is superimposed on an output signal without change. Although a falling edge of the phase signal CK1 is at a position of timing t0, a falling edge of the phase signal CKout" is at a position of timing t2. A difference between timings t0 and t1 becomes phase noise.

On the other hand, the phase blend circuit outputs a phase signal CKout when the phase signal CK1 is input, and outputs a phase signal CKout' when the phase signal CK1' is input. The falling edge of the phase signal CKout' is at any position between timings t0 and t1. Statistically, the falling edge of the phase signal CKout' is likely to be at a position of timing t1 midway between timings t1 and t1. When the falling edge of the phase signal CKout' is at the position of timing t1, the phase noise superimposed on the output signal is only half the phase noise superimposed on the input signal. Therefore, the phase noise superimposed on the output signal of the phase blend circuit is reduced more than the phase noise superimposed on the output signal of the buffer circuit.

In Reference Literature (Kiichi Niitsu, et al., "A Clock Jitter Reduction Circuit Using Gated Phase Blending Between Self-Delayed Clock Edges," 2012 Symposium on VLSI Circuits Digest of Technical Papers, pp. 142 to 143), technology capable of reducing phase noise by blending a plurality of clock signals is described. In this embodiment, a technique described in Reference Literature is used.

It is also possible to reduce phase noise superimposed on a "high-speed counter clock" by applying the phase blend circuit to a "high-speed counter clock" in the imaging apparatus described in the publication of Japanese Unexamined Patent Application, First Publication No. 2005-303648.

According to this embodiment, in the imaging apparatus, the plurality of signal transmission circuits include: first circuits (first main buffer circuits MB1_0, MB1_1, . . . ), each of which is configured to transmit a third phase signal (phase signal CK[0]) which is any one of the plurality of phase signals; second circuits (second main buffer circuits MB2_0, MB2_1, . . . ) configured to be substantially the same as the first circuits and configured to transmit the third phase signals; and phase blend circuits PB_0, PB_1, . . . configured to blend the third phase signals transmitted by the first circuits and the third phase signals transmitted by the second circuits. Thereby, it is possible to suppress phase noise superimposed on the phase signal.

While preferred embodiments of the invention have been described and illustrated above, it should be understood that these are exemplary of the invention and are not to be considered as limiting. Additions, omissions, substitutions, and other modifications can be made without departing from the spirit and scope of the present invention. Accordingly, the invention is not to be considered as being limited by the foregoing description, and is only limited by the scope of the appended claims.

What is claimed is:

1. An imaging apparatus comprising:
    an imaging unit in which a plurality of pixels, each of which has a photoelectric conversion element and is configured to output a pixel signal, are disposed in a matrix of M (M is a natural number greater than or equal to 2) rows by N (N is a natural number greater than or equal to 2) columns;
    a reference signal generation unit configured to generate a reference signal which increases or decreases over time;
    a comparison unit configured to compare the pixel signal to the reference signal and end a comparison process at a timing at which the reference signal satisfies a predetermined condition with respect to the pixel signal;
    a clock generation unit having a plurality of delay units and configured to generate a plurality of phase signals having phases different from each other based on signals output from the plurality of delay units;
    a signal transmission unit provided to correspond to the plurality of phase signals and having a plurality of signal transmission circuits configured to transmit the plurality of phase signals; and
    a latch unit having a plurality of latch circuits configured to latch the plurality of phase signals transmitted by the signal transmission unit at the timing of an end of the comparison process,
    wherein the plurality of signal transmission circuits have main buffer circuits, wherein a configuration of the signal transmission circuit that transmits a first phase signal which is any one of the plurality of phase signals is substantially the same as a configuration of the signal transmission circuit that transmits a second phase signal which is any one of the plurality of phase signals and is different from the first phase signal, and wherein a configuration of the latch circuit that latches the first phase signal is substantially the same as a configuration of the latch circuit that latches the second phase signal.

2. The imaging apparatus according to claim 1, wherein the plurality of signal transmission circuits include:

a first circuit configured to transmit a third phase signal which is any one of the plurality of phase signals;

a second circuit configured to be substantially the same as the first circuit and configured to transmit the third phase signal; and a phase blend circuit configured to blend the third phase signal transmitted by the first circuit and the third phase signal transmitted by the second circuit.

3. The imaging apparatus according to claim 1, wherein the plurality of latch circuits include:

a logic circuit to which the plurality of phase signals transmitted by the signal transmission unit are input; and a main body circuit configured to latch a signal output from the logic circuit.

4. The imaging apparatus according to claim 1, wherein the plurality of signal transmission circuits have sub-buffer circuits disposed at a subsequent stage side of the main buffer circuits and a previous stage side of the plurality of latch circuits on a path through which the plurality of phase signals are transmitted.

* * * * *